United States Patent
Okada et al.

(10) Patent No.: US 7,724,071 B2
(45) Date of Patent: May 25, 2010

(54) VOLTAGE BOOSTING DEVICE AND METHOD FOR SEMICONDUCTOR DEVICE

(75) Inventors: Akira Okada, Tokyo (JP); Masaru Yano, Tokyo (JP); Kazuhide Kurosaki, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 199 days.

(21) Appl. No.: 11/493,467

(22) Filed: Jul. 25, 2006

(65) Prior Publication Data

US 2007/0085597 A1  Apr. 19, 2007

Related U.S. Application Data

(63) Continuation-in-part of application No. PCT/JP2005/013607, filed on Jul. 25, 2005.

(51) Int. Cl.
*G05F 1/02* (2006.01)
(52) U.S. Cl. .................. 327/536; 365/185.18; 365/226
(58) Field of Classification Search ......... 327/534–537; 365/185.18, 185.19, 226
See application file for complete search history.

(56) References Cited

U.S. PATENT DOCUMENTS

| | | | | |
|---|---|---|---|---|
| 6,285,622 B1 * | 9/2001 | Haraguchi et al. | .......... | 365/226 |
| 6,320,797 B1 * | 11/2001 | Liu | ....................... | 365/189.11 |
| 6,438,034 B1 * | 8/2002 | Tanzawa | ................. | 365/185.18 |
| 6,515,535 B2 * | 2/2003 | Myono | ....................... | 327/536 |
| 6,567,309 B2 * | 5/2003 | Tanzawa | ................. | 365/185.18 |
| 6,801,455 B2 * | 10/2004 | Natori | ................... | 365/185.18 |
| 6,901,009 B2 * | 5/2005 | Natori | ................... | 365/185.18 |
| 6,901,012 B2 * | 5/2005 | Ikehashi et al. | ......... | 365/189.15 |
| 7,176,748 B2 * | 2/2007 | Khouri et al. | ................ | 327/536 |

FOREIGN PATENT DOCUMENTS

| JP | 06020485 | 1/1994 |
|---|---|---|
| JP | 06259981 | 9/1994 |
| JP | 2000075940 | 3/2000 |
| JP | 2000514946 | 11/2000 |
| JP | 2002101644 | 4/2002 |

* cited by examiner

*Primary Examiner*—Lincoln Donovan
*Assistant Examiner*—Patrick O'Neill

(57) ABSTRACT

A semiconductor device includes: a pump circuit that boosts an output node connected to a memory cell array; an oscillator that outputs a clock to the pump circuit; and a detection circuit that outputs an actuating signal to the oscillator. In this semiconductor device, the actuating signal actuates the oscillator when the voltage of the output node of the pump circuit is lower than a first reference voltage, and the actuating signal stops the oscillator when the voltage of the output node is higher than a second reference voltage. In accordance with the present invention, when the voltage of the output node of the pump circuit is higher than the target voltage, the oscillator is stopped, and so is the pump circuit. Thus, unnecessary charge flow to the ground can be prevented, and the power consumption of the booster circuit can be reduced.

19 Claims, 19 Drawing Sheets

US 7,724,071 B2

VOLTAGE BOOSTING DEVICE AND METHOD FOR SEMICONDUCTOR DEVICE

CROSS-REFERENCES TO RELATED APPLICATIONS

This is a continuation in part of International Application No. PCT/JP2005/013607, filed Jul. 25, 2005 which was not published in English under PCT Article 21(2).

TECHNICAL FIELD

The present invention generally relates to a semiconductor device and a method of controlling the semiconductor device, and more particularly, to a semiconductor device that has a pump circuit for boosting the lines connected to memory cells and a method of controlling the semiconductor device.

BACKGROUND OF THE INVENTION

Description of the Related Art

In some semiconductor memory devices, the voltages of the lines (bit lines or word lines) connected to memory cells are made higher than the source voltage, and a pump circuit is employed for voltage boosting. In the following, a flash memory that is a typical non-volatile memory will be described as an example. Each transistor that forms a memory cell in a flash memory has a floating gate or an insulating film called a charge accumulating layer. Charges are accumulated in the charge accumulating layer, so as to store data. The accumulating (writing) of charges in the charge accumulating layer is performed by injecting hot electrons or hot holes to the charge accumulating layer. The hot electrons or hot holes are made to have high energy between the source and the drain. Accordingly, a positive voltage is applied to the word line connected to the gate, while a high positive voltage is applied to the bit line connected to the drain. For example, while the source voltage is 3 V, a voltage of 4 V is applied to the bit line.

Referring to FIG. 1 (PRIOR ART), a conventional pump circuit (prior art 1) is described. FIG. 1 (PRIOR ART) illustrates the structure of a booster circuit. When a voltage of 4 V is applied to the bit line, the following operation is performed. First, an oscillator 2 outputs a clock to a pump circuit 8. If the clock is at the high level, the pump circuit 8 stores charges. The voltage DPUMP of the output node of the pump circuit 8 is increased to approximately 6 V, while the source voltage Vcc is 3 V. When DPUMP exceeds 6 V, the charges boosted by the pump circuit 8 flow to the ground through a regulation circuit 6, so as to maintain an almost constant level. A level adjuster 4 adjusts the output DPUMP of the pump circuit 8 to 4 V, which is the voltage necessary for the bit line.

Among flash memories, there are SONOS (Silicon Oxide Nitride Oxide Silicon) flash memories each having charges accumulating in a trap layer formed with a silicon nitride layer for a higher memory capacity. Japanese Patent Application Publication No. 2000-514946 (Patent Document 1) discloses such a flash memory. Each memory cell in this flash memory has a virtual-ground structure in which the source and the drain are replaced with each other and are operated symmetrically. When data writing is performed in this flash memory, the source is grounded, and high voltages are applied to the gate and the drain. By doing so, hot electrons are injected to the trap layer, so as to perform data writing. Here, a voltage (4V, for example) that is equal to or higher than the source voltage is applied to the drain. Accordingly, a pump circuit that boosts the voltage from the source voltage (3 V, for example) to a higher voltage (4 V, for example) becomes necessary. Japanese Unexamined Patent Publication No. 6-20485 (Patent Document 2) discloses a circuit that has a capacitor connected to the output node of the pump circuit (prior art 2).

In the prior art 1, however, when continuous programming is performed for core cells (equivalent to 128 bits, for example) connected to the same word line, a plural number of bit lines are boosted at the same time. In such a case, the pump circuit 8 performs the boosting operation repeatedly and continuously. As a result, the power consumption of the booster circuit becomes large.

SUMMARY OF THE INVENTION

It is therefore an object of the present invention to provide a semiconductor device and a method of controlling the semiconductor device in which the above disadvantage is eliminated.

A more specific object of the present invention is to provide a semiconductor device that can reduce the power consumption of the booster circuit, and a method of controlling such a semiconductor device.

According to a first aspect of the present invention, there is provided a semiconductor device including: a pump circuit that boosts an output node connected to a memory cell array; an oscillator that outputs a clock to the pump circuit; and a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage.

According to a second aspect of the present invention, there is provided a method of controlling a semiconductor device that includes a pump circuit that boosts an output node connected to a memory cell array, and an oscillator that outputs a clock to the pump circuit, the method comprising the steps of: actuating the oscillator when a voltage of the output node of the pump circuit is lower than a first reference voltage; and stopping the oscillator when the voltage of the output node is higher than a second reference voltage.

DESCRIPTION OF THE PREFERRED EMBODIMENTS

A description will now be given, with reference to the accompanying drawings, of embodiments of the present invention.

First Embodiment

A flash memory in accordance with a first embodiment of the present invention is the same as the SONOS flash memory disclosed in Patent Document 1, and is of a virtual ground array type. This flash memory is to be used as a flash memory that operates with the same interface as that of a NAND flash memory. In a NAND flash memory, memory cells that store charges in a floating gate are normally employed. Writing in such memory cells is performed through a FN tunneling phenomenon by generating a high potential between the control gate on the floating gate and the substrate. Accordingly, data of one page (2 Kbytes, for example) can be collectively written. Meanwhile, in the flash memory in accordance with the first embodiment, data writing is performed through a hot electron phenomenon. Accordingly, a high current is required at the time of writing, and there is a limit to the amount of data that can be written at once. However, in the flash memory in accordance with the first embodiment, the interface to the outside operates as a NAND flash memory. Therefore, the amount of data that is to be programmed consecutively is determined by the request for programming the largest possible amount of data to increase the programming speed and the request for stabilizing the bit-line voltage if a high current is required for data writing. In the first embodiment, continuous programming is performed for each 128 bits, for example. In other words, 128 consecutive core cells connected to the same word line are programmed.

Figure 1:
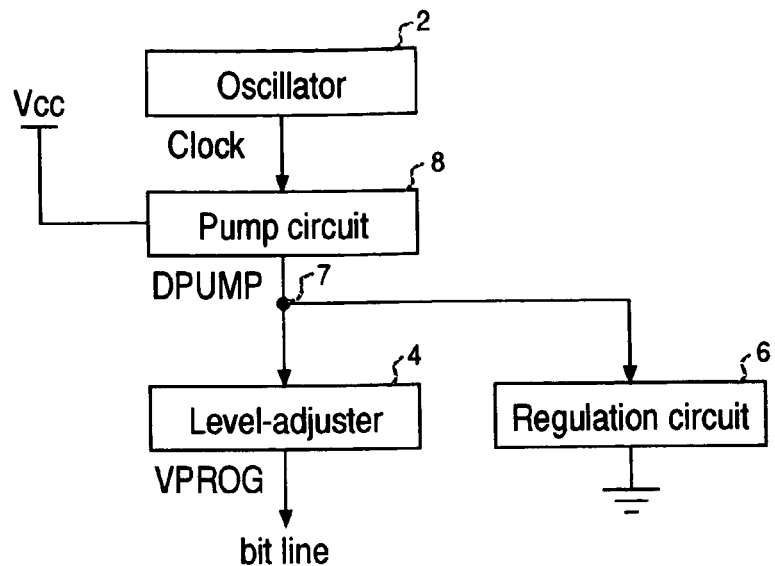
FIG. 1 illustrates the structure of the booster circuit of a flash memory in accordance with a prior art 1.
Figure 2:
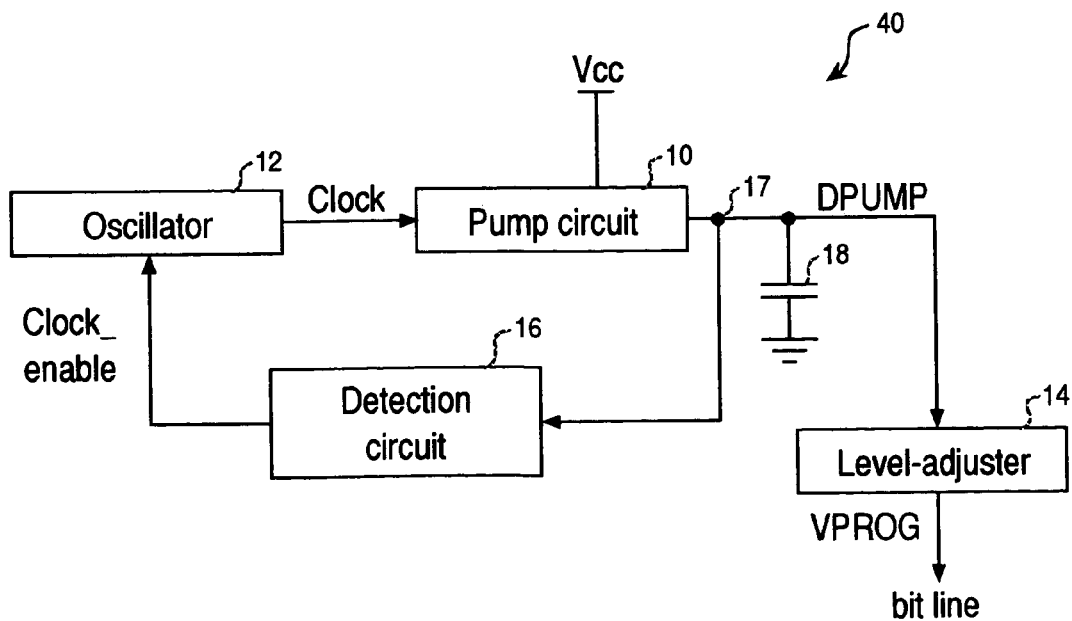
FIG. 2 illustrates the structure of the booster circuit of a flash memory in accordance with a first embodiment of the present invention.

FIG. 2 illustrates the structure of a booster circuit 40 of the flash memory in accordance with the first embodiment. An oscillator 12 outputs a clock to a pump circuit 10. The pump circuit 10 is connected to a memory cell 22 (a core cell), and boosts an output node 17 of the pump circuit 10 to a higher voltage than a source voltage Vcc (3 V, for example). The voltage of the output node 17 (DPUMP) is detected by a detection circuit 16. If DPUMP is higher than a reference voltage (6 V, for example), the detection circuit 16 sets an actuating signal Clock_enable at the low level. If DPUMP is lower than the reference voltage, the detection circuit 16 sets the actuating signal Clock_enable at the high level. When the actuating signal Clock_enable is at the high level, the oscillator 12 outputs a clock to the pump circuit 10. When the actuating signal Clock_enable is at the low level, the oscillator 12 does not output a clock.

A capacitor 18 is linked to the output node 17, and charges transferred from the pump circuit 10 are stored in the capacitor 18. The output node 17 is connected to a level adjuster 14. The level adjuster 14 adjusts the voltage to be output to the bit line to a constant value (4 V), and then outputs the voltage to the bit line.

Figure 3:
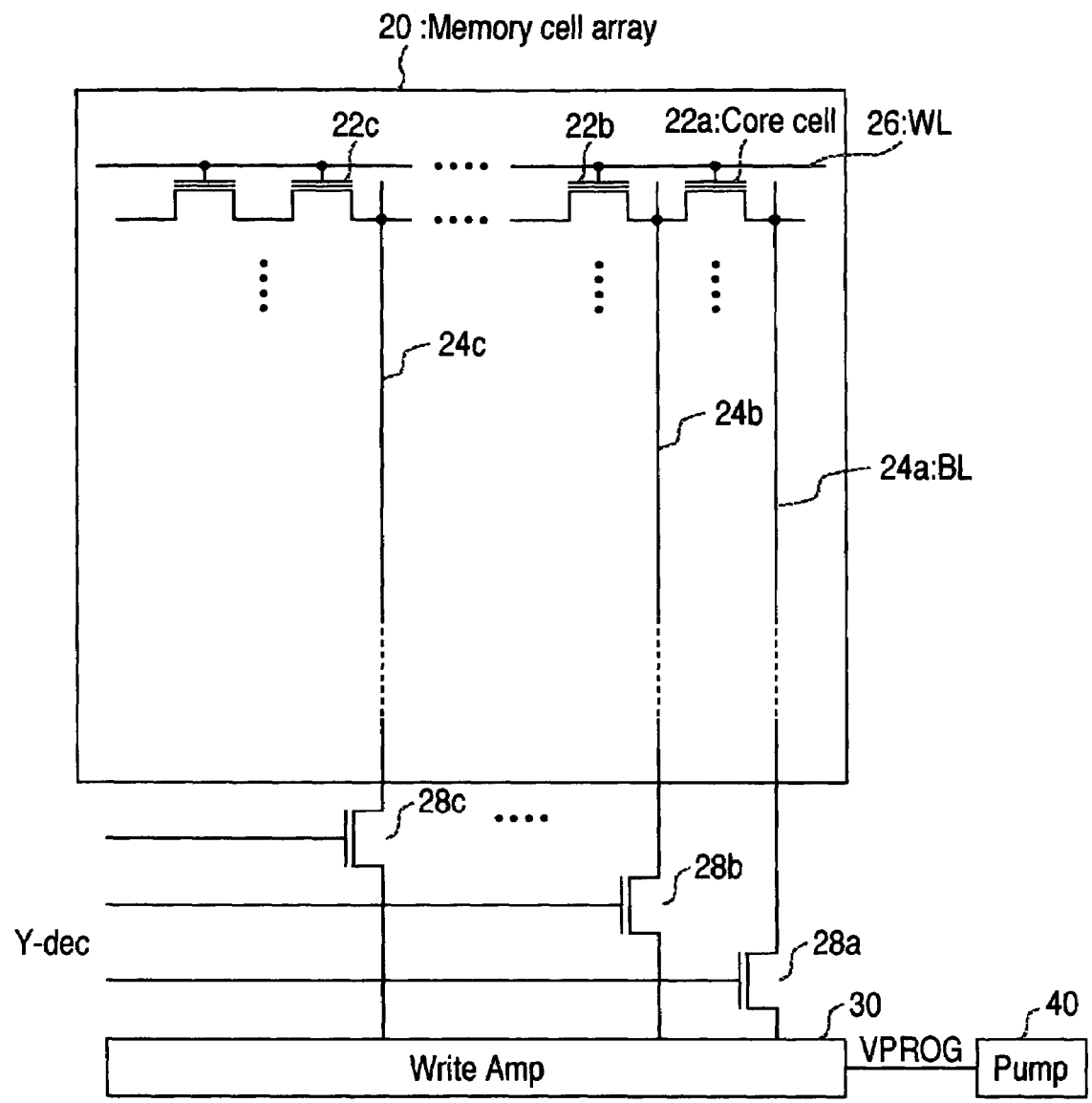
FIG. 3 illustrates the memory cells and the peripheral area of the flash memory in accordance with the first embodiment.

FIG. 3 illustrates the structure of the memory cell array and its periphery in the flash memory in accordance with the first embodiment. In a memory cell array 20, core cells 22 are arranged in a matrix fashion. The gate of each core cell 22 is connected to a word line 26, and the source and the drain of each core cell 22 are connected to difference bit lines 24. The word lines 26 are arranged in the vertical direction of FIG. 3, while the bit lines 24 are arranged in the horizontal direction. The bit lines 24a, 24b, and 24c are connected to a write amplifier 30 via FETs 28a, 28b, and 28c. The FETs 28a, 28b, and 28c are connected to a Y-decoder, and connects each bit line 24, which is to be programmed, to the write amplifier 30. The booster circuit 40 is connected to the write amplifier 30.

When data is written into a core cell 22, the word line 26 to be used in the writing is selected, and a positive voltage is applied to the word line 26. A voltage (4 V) that is boosted to a voltage equal to or higher than the source voltage (3 V) is supplied from the booster circuit 40 to the write amplifier 30. The write amplifier 30 sets the bit line 24a, which is selected by the Y-decoder through the FET 28a, at 4 V. By doing so, the drain of the transistor of the core cell 22a is set at 4 V. The source of the core cell 22a is selected by a FET (not shown) and is connected to the ground. Thus, data is written into the core cell 22a. When data is written into the core cell 22b, the same operation as that for the core cell 22a is performed. In the case where each 128 core cells 22 connected to the same word line 26 are to be programmed continuously, the write amplifier 30 selects a core cell 22 into which data is to be written among the 128 core cells 22 to be programmed. Data is then written into the selected core cell 22 in the above described manner.

As described above, in the case where continuous programming is performed for each 128 bits, the booster circuit 40 boosts up to 128 bit lines 24 at the same time, and therefore, needs to be able to provide a large number of charges. This is because, in the initial stage of writing, a high write current flows to the ground from the memory cells. Meanwhile, writing might be performed for a relatively small number of core cells 22 among the 128 bits to be programmed. In such a case, the number of bit lines 24 to be boosted is also relatively small. In the prior art 1, when the voltage DPUMP becomes high in the above described situation, unnecessary charges are released to the ground through the regulation circuit 6. As a result, the power consumption becomes large.

In the booster circuit 40 of the flash memory in accordance with the first embodiment, if the voltage DPUMP of the output node 17 of the pump circuit 10 is lower than a target voltage (the first reference voltage), the oscillator 12 is actuated. If the voltage DPUMP of the output node 17 is higher than a target voltage (the second reference voltage), the detection circuit 16 outputs an actuating signal for stopping the oscillator 12, to the oscillator 12. Accordingly, when the voltage DPUMP is higher than the target voltage, the oscillator 12 is stopped. At the same time, the pump circuit 10 is also stopped. In this manner, unnecessary charges can be prevented from flowing to the ground through the regulation circuit 6 as in the prior art 1. Thus, the power consumption can be reduced. Here, the first reference voltage may be the same as or different from the second reference voltage.

The booster circuit 40 also includes the capacitor 18 linked to the output node 17. In the case where 128 bit lines 24 are to be boosted as in the first embodiment, a large number of charges are required. Therefore, the charges boosted by the pump circuit 10 are stored in the capacitor 18, so as to a drop of the voltage is reduced at the time of writing.

The capacity of the capacitor 18 can be made larger than the sum of the wiring capacities of the bit lines (the lines) that are connected to the output node and can be selected at the same time. Accordingly, the charges required for boosting a large number of bit lines that need to be boosted at the same time can be stored in the capacitor 18. In the first embodiment, the wiring capacity of each bit line 24 is approximately 5 pF. The number of bit lines that can be selected at the same time is 128, which is equivalent to 128 bits that can be simultaneously boosted for continuous programming. Therefore, it is preferable to set the capacity of the capacitor 18 at 640 pF (5 pF×128) or larger.

The booster circuit 40 may further include the level adjuster 14 that is connected to the output node 17 and adjusts the voltage of each bit line 24 to a constant value. With the level adjuster 14, the voltage of each bit line 24 can be made more stable.

Figure 4A:
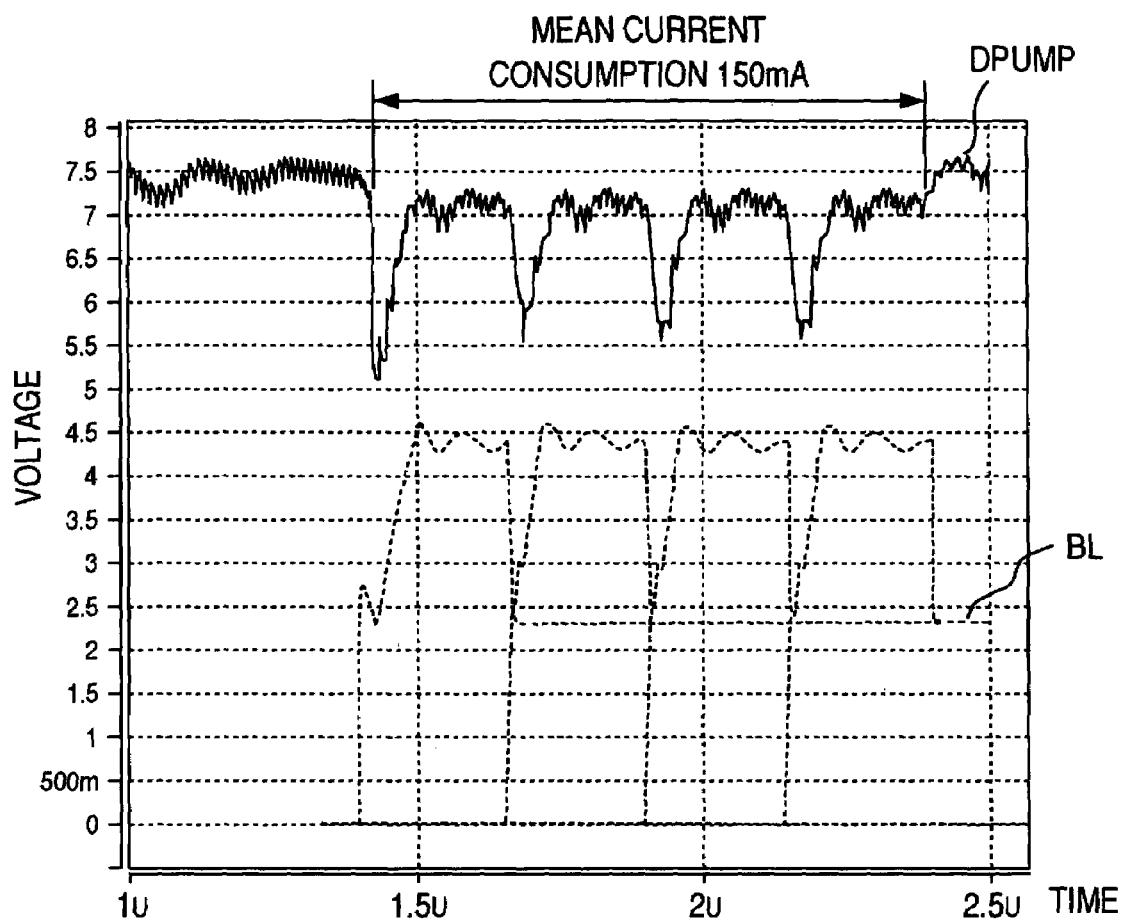
FIG. 4A shows changes with time in the voltage DPUMP and the bit line voltage (BL) at the time of programming in the prior art 1.
Figure 4B:
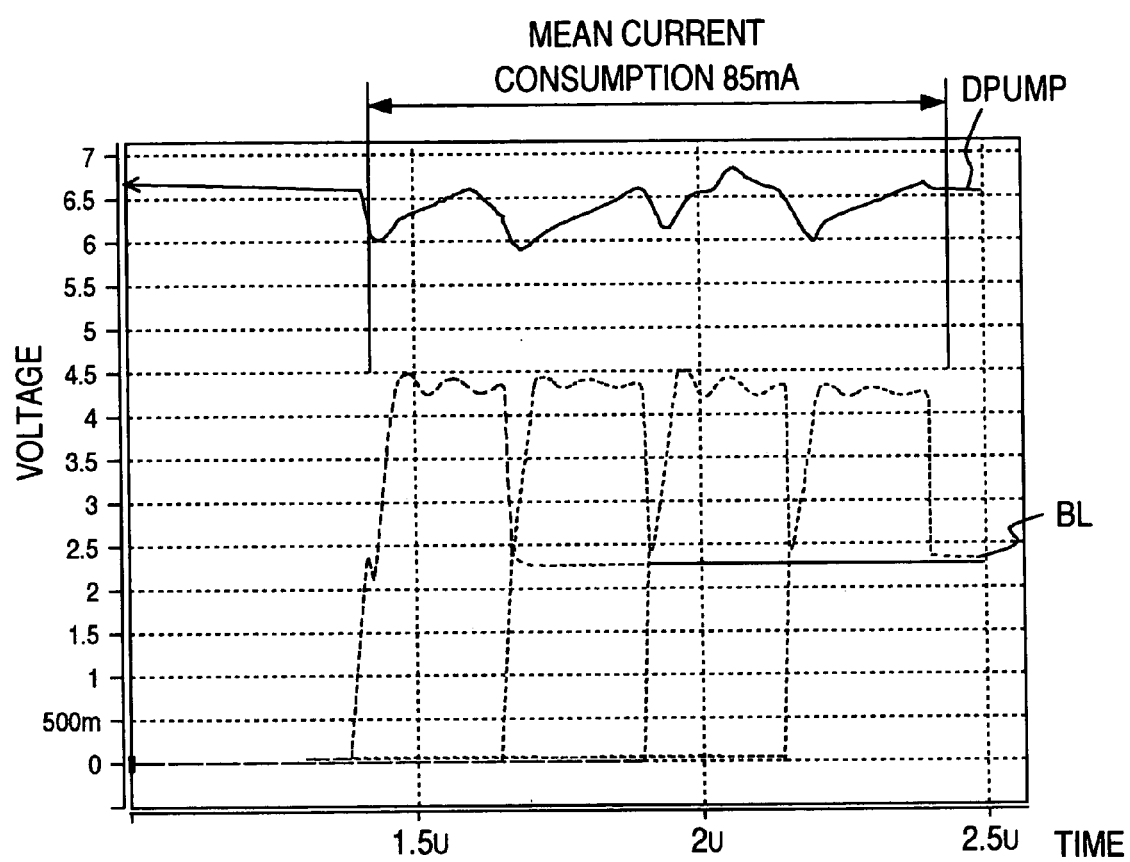
FIG. 4B shows changes with time in DPUMP and BL at the time of programming in the first embodiment.
Figure 4C:
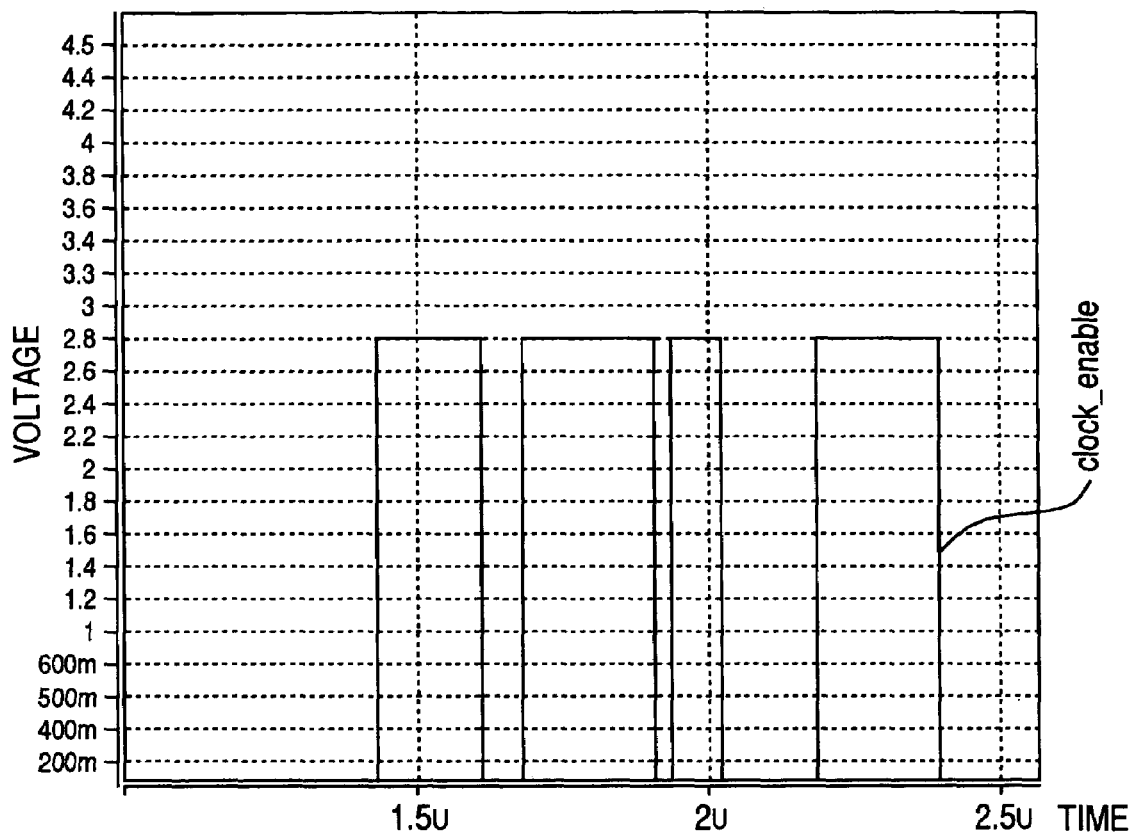
FIG. 4C shows the voltage of a Clock_enable signal in the first embodiment.

FIGS. 4A through 4C show the results of simulations carried out to check the current consumption obtained by performing 128-bit continuous programming 4 times in the flash memories of the first embodiment 1 and the prior art 1. FIG. 4A shows the changes in voltages of DPUMP and bit lines (BL) with time in the prior art 1. FIG. 4B shows the changes in voltages of DPUMP and BL with time in the first embodiment. FIG. 4C shows the voltage of the Clock_enable signal in the first embodiment. In each of FIGS. 4A and 4B, the range shown by the arrows indicates the four repetitions of programming.

As can be seen from FIGS. 4B and 4C, the voltage of DPUMP drops when charges are supplied from DPUMP to BL at the start of programming. When the voltage of DPUMP becomes equal to or lower than the reference voltage, the detection circuit 16 sets Clock_enable to the high level. The oscillator 12 that receives Clock_enable then starts operating, and the pump circuit 10 also starts operating. As charges are supplied from DPUMP to BL, the voltage of BL increases. When the voltage of BL becomes constant, and the voltage of DPUMP recovers and becomes higher than the reference voltage, the detection circuit 16 sets Clock_enable to the low level. As the oscillator 12 stops operating, the pump circuit 10 also stops operating. When the next programming operation starts, charges are supplied from DPUMP to BL, and the voltage of DPUMP drops accordingly. The above procedures are then repeated. The waveforms of the respective voltages slightly vary among the programming operations, because the bit patterns to be written in the programming operations vary.

The current consumed each time the booster circuit 40 performs a programming operation among the four repetitive programming operations is 85 mA in the first embodiment as opposed to 150 mA in the prior art 1. Thus, in the first embodiment, the current consumption can be reduced by virtue of the detection circuit 16.

Figure 5A:
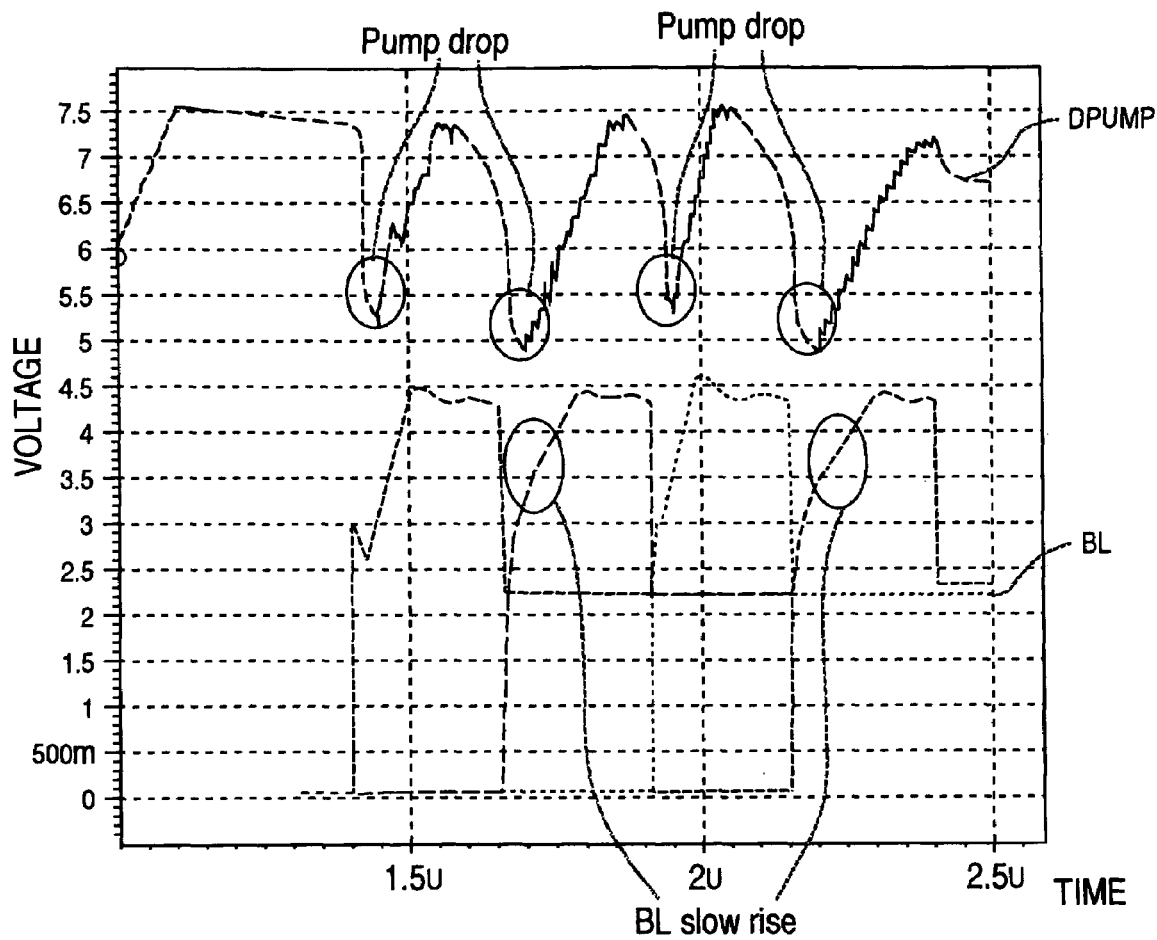
FIG. 5A shows a change with time in each voltage at the time of programming in a case where a capacitor is not linked to the output node of the pump circuit.
Figure 5B:
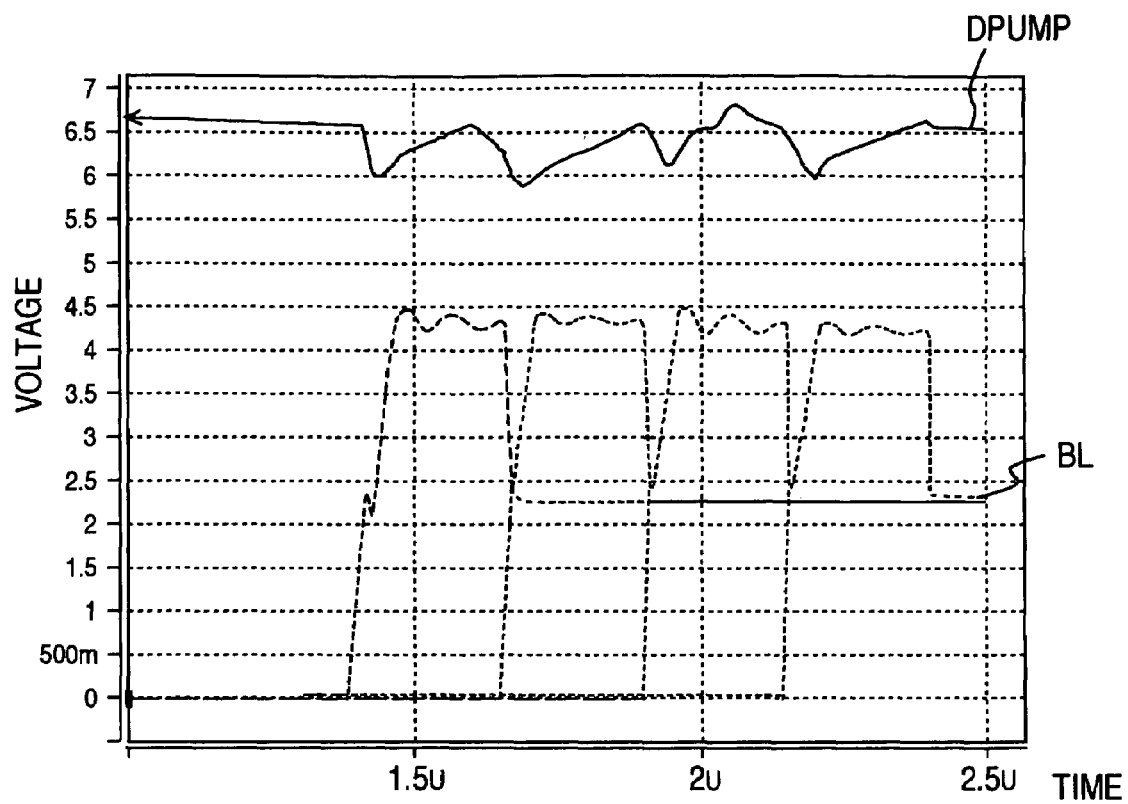
FIG. 5B shows change with time in each voltage at the time of programming in a case where a capacitor is linked to the output node of the pump circuit in the first embodiment.

FIGS. 5A and 5B show the results of simulations carried out to check the voltages of DPUMP and BL in a case where the capacitor 18 is provided in the flash memory of the first embodiment and in a case where the capacitor 18 is not provided in the flash memory. FIG. 5A shows the results of the simulation carried out in the case where the capacitor 18 is not provided. FIG. 5B shows the results of the simulation carried out in the case where the capacitor is provided (the first embodiment). The programming operations and the details of graphs are the same as those in FIGS. 4A through 4C. As can be seen from FIG. 5A, the voltage of DPUMP in the initial stage of programming is low, and does not recover quickly. Especially in the late stage of each of the first through third programming operations, each corresponding one of the second through fourth programming operations starts, as the pump circuit 10 stops operating and the voltage of DPUMP drops. Therefore, the voltage of BL is slow to increase. As can be seen from FIG. 5B, in the first embodiment, the delay of the decrease in the voltage of DPUMP and the delay of the increase in the voltage of BL are small. In this manner, the decrease in the voltage of DPUMP can be reduced by virtue of the capacitor 18, and the increase in the voltage of BL is accelerated.

Figure 6:
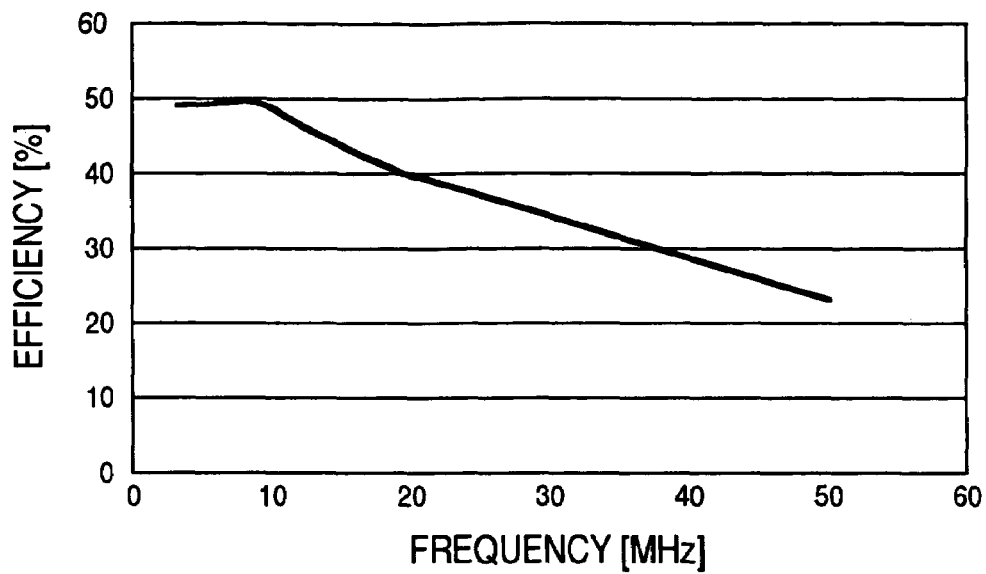
FIG. 6 shows the results of calculations carried out to determine the efficiency of the pump circuit in relation to frequency.

To accelerate the increase in voltage by the pump circuit 10, the frequency of the clock to be output from the oscillator 12 may be made higher (or the cycles may be made shorter). FIG. 6 shows the results of calculations performed to determine the efficiency in relation to the frequency of the clock of the pump circuit 10. Here, the output voltage of the pump circuit 10 is Vp, the source voltage applied to the pump circuit 10 is Vcc, the current obtained when the output of the pump circuit 10 is grounded to force a current to flow is Ip, and the current consumption from the power source is Ivcc. The efficiency Eff is expressed as: $Eff=(Vp \times Ip)/(Vcc \times Ivcc) \times 100(\%)$.

As shown in FIG. 6, the efficiency is constant while the frequency of the clock is low, but the efficiency decreases when the frequency becomes higher. This is because a leakage current flows to the CMOS, as the CMOS such as the pump circuit 10 is switched on and off more frequently. When the frequency of the clock is made higher to restrain the decrease in the voltage of DPUMP as shown in FIG. 5A, the power consumption increases. In the first embodiment, the capacitor 18 is provided to restrain the decrease in the voltage of DPUMP. Accordingly, the frequency of the clock can be made equal to or lower than the frequency at which the efficiency of the pump circuit 10 does not substantially depend on the frequency (or the frequency at which the efficiency of the pump circuit 10 does not affect the power consumption). Thus, the efficiency of the pump circuit 10 can be increased, and the power consumption can be reduced further.

Figure 7A:
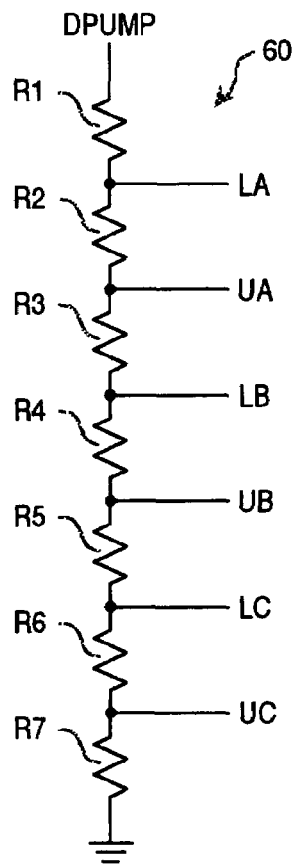
FIGS. 7A through 7C are circuit diagrams showing parts of the detection circuit of the flash memory in accordance with the first embodiment.

Next, an example of the detection circuit 16 of the first embodiment is described. FIGS. 7A through 9 are circuit diagrams of the detection circuit 16. FIG. 7A shows a circuit 60 that divides the output DPUMP of the pump circuit 10 by using the resistances, so as to decrease DPUMP to a voltage at a constant ratio. Resistors R1, R2, R3, R4, R5, R6, and R7 are connected in series between the output node 17 of the pump circuit 10 and the ground. Terminals LA, UA, LB, UB, LC, and UC are connected between the resistors R1 and R2, between the resistors R2 and R3, between the resistors R3 and R4, between the resistors R4 and R5, between the resistors R5 and R6, and between the resistors R6 and R7, respectively. Those terminals are provided for mode A, mode B, and mode C (a reading mode, an erasing mode, and a writing mode, for example) to charge bit lines at different voltages. There are reference terminals for turning on and off the pump circuit 10 in each mode. The terminal UC is used as the reference terminal for turning off the pump circuit 10 in the mode C, while the terminal LC is the reference terminal for turning on the pump circuit 10 in the mode C. The same applies to the terminals UA, LA, UB, and LB.

Figure 7B:
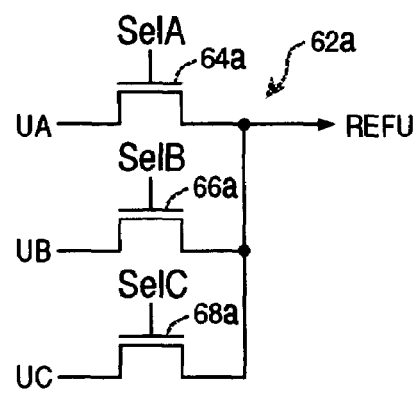
Figure 7C:
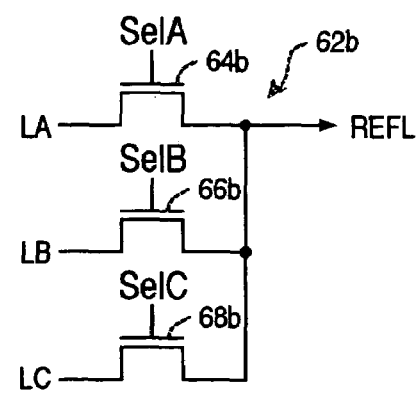

FIGS. 7B and 7C show circuits 62a and 62b for selecting the reference terminal for turning off the pump circuit 10 and for selecting the reference terminal for turning on the pump circuit 10 in each mode. As shown in FIG. 7B, in the turn-off reference selecting circuit 62a, the terminals UA, UB, and UC are connected to the sources of the selecting FETs 64a, 66a, and 68a, respectively. One of the inputs is selected in accordance with FET selecting signals SelA, SelB, and SelC that are input to the gates of the respective FETs 64a, 66a, and 68a. The selected input is output as REFU through the drain. In this description, the input UC that is the upper limit of the writing mode C is selected. The lower-limit selecting circuit 62b shown in FIG. 7C has the same structure as above, and the input LC is selected and is output as REFL.

Figure 8A:
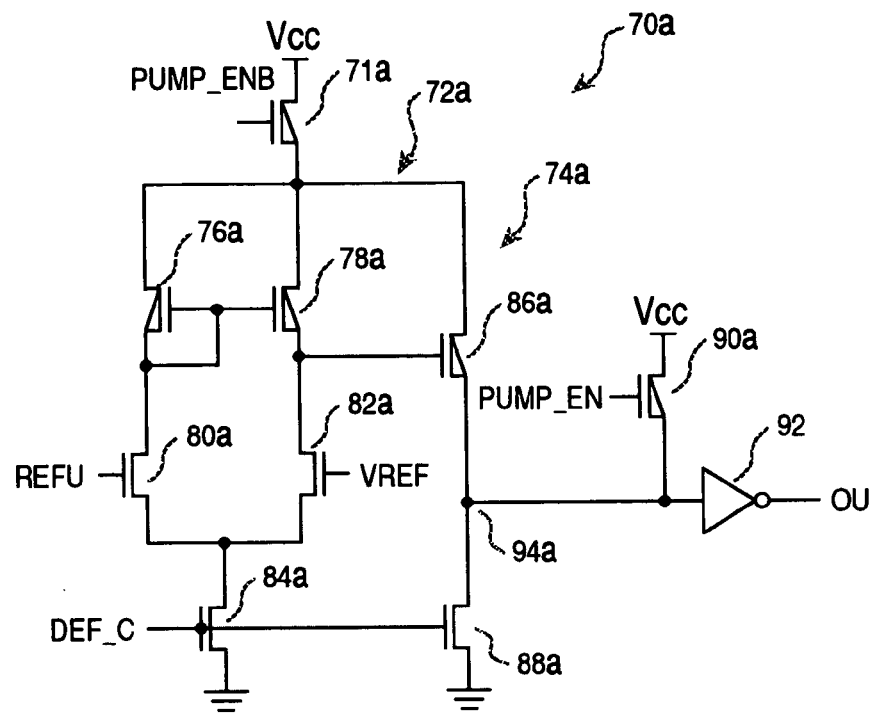
FIGS. 8A and 8B are circuit diagrams showing other part of the detection circuit of the flash memory in accordance with the first embodiment.

FIG. 8A shows a comparator circuit 70a that sets an OU signal to the high level when DPUMP is higher than the second reference voltage, and sets the OU signal to the low level when the DPUMP is lower than the second reference voltage. A current-mirror differential amplifier 72a is connected between the power source Vcc and the ground. The differential amplifier 72a includes p-FETs 76a and 78a, and n-FETs 80a, 82a, and 84a. The FET 84a is a current source that adjusts the voltage to be applied to the differential amplifier 72a with DEF_C. REFU and a reference voltage VREF are input to the differential amplifier 72a. The difference between VREF and REFU is amplified, and is output from the differential amplifier 72a. A comparator 74a is connected between the power source Vcc and the ground, and includes a p-FET 86a and an n-FET 88a. The output of the differential amplifier 72a is input to the gate of the FET 86a, and DEF_C is input to the FET 88a. The output node 94a of the comparator 74a is set to the low level when REFU is higher than VREF, and to the high level when REFU is lower than VREF. The p-FETs 71a and 90a are switches that turn on and off the comparator circuit 70a with a pump driving signal PUMP_ENB or PUMP_EB. The output OU of the comparator circuit 70a inverts a signal through an inverter 92, and outputs the signal through the output node 94a. Accordingly, the output OU is at the high level if REFU is higher than VREF, and at the low level if REFU is lower than VREF. Since REFU (UC) is a voltage obtained by dividing DPUMP, the comparison between REFU and VREF is equivalent to the comparison between the DPUMP and the voltage obtained by dividing VREF at the voltage dividing ratio. Accordingly, the voltage obtained by dividing VREF at the voltage dividing ratio is the second reference voltage.

Figure 8B:
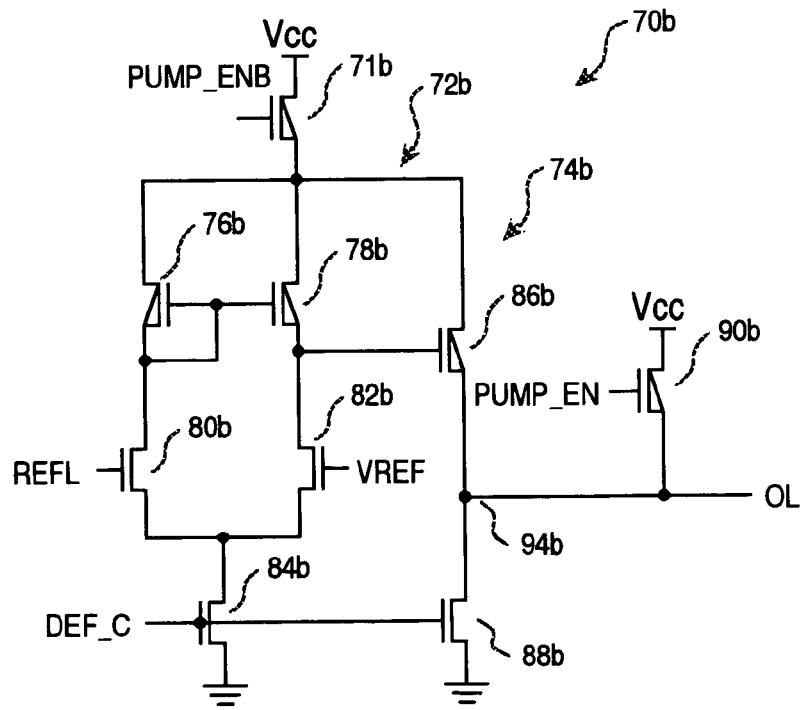

FIG. 8B shows a comparator circuit 70b that sets an OL signal to the high level when DPUMP is lower than the first reference voltage, and to the low level when DPUMP is higher than the first reference voltage. The comparator circuit 70b has the same structure and functions as those of the comparator circuit 70a, except that an inverter equivalent to the inverter 92 is not provided. Accordingly, the OL signal is at the high level if REFL is lower than VREF, and at the low level if REFL is higher than VREF. The voltage obtained by dividing VREF at the dividing ratio of REFL (LC) to DPUMP is the first reference voltage.

Figure 9:
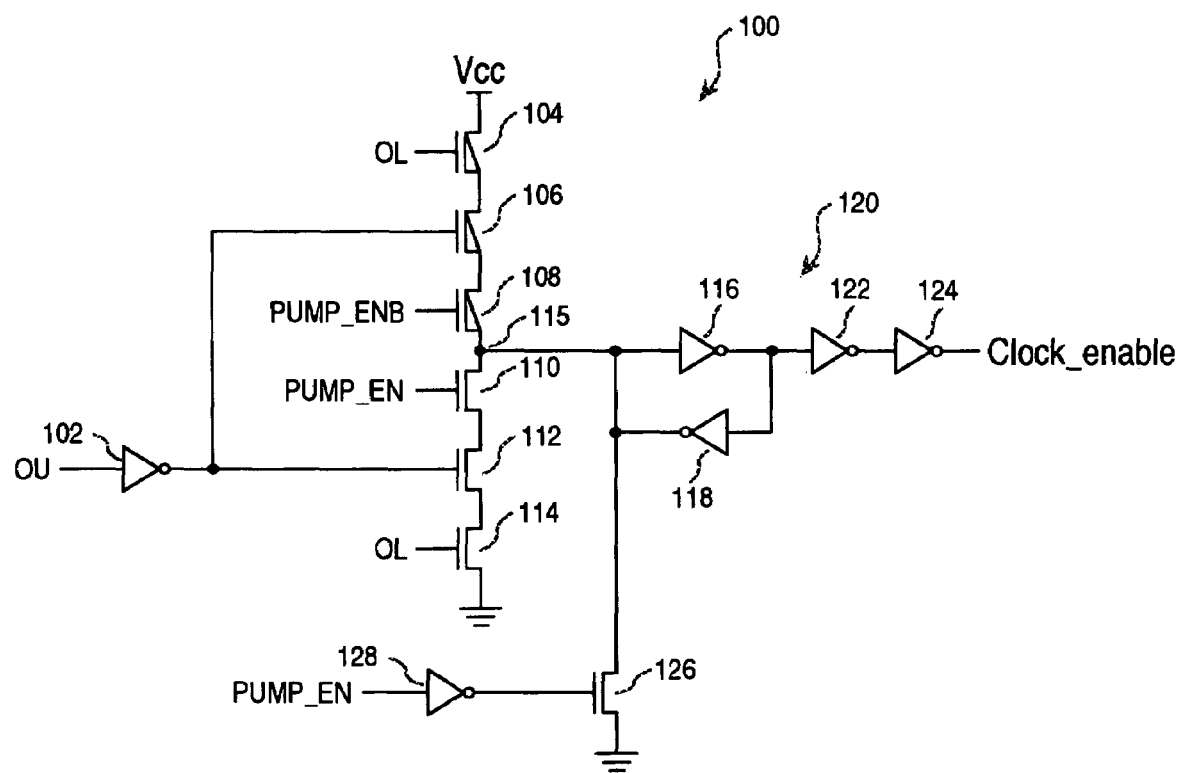
FIG. 9 is a circuit diagram showing the remaining part of the detection circuit of the flash memory in accordance with the first embodiment.

FIG. 9 shows a circuit 100. Once DPUMP becomes lower than the first reference voltage, the circuit 100 sets Clock_enable to the high level until DPUMP becomes higher than the second reference voltage. Once DPUMP becomes higher than the second reference voltage, the circuit 100 sets Clock_nable to the low level until DPUMP becomes lower than the first reference voltage. As shown in FIG. 9, p-FETs 104, 106, and 108, and n-FETs 110, 112, and 114 are connected in series between the power source Vcc and the ground. The output OL is input to the gates of the FETs 104 and 114. The output OU inverted by an inverter 102 is input to the gates of the FETs 106 and 112. The pump driving signals PUMP_ENB and PUMP_EN are input to the gates of the FETs 108 and 110. The input of a flip-flop 120 formed with inverters 116 and 118 is connected to a node 115 located between the FETs 108 and 110. The output of the flip-flop 120 is connected to inverters 122 and 124, and is output as Clock_nable. The node 115 is also grounded via the FET 126. The pump driving signal PUMP_EN is connected to the FET 126 via an inverter 128, and is turned on and off with the pump driving signal PUMP_EN.

In the circuit 100, when the output OU is at the high level while the output OL is at the low level, the node 115 is at the high level. Accordingly, Clock_enable is at the low level. When the output OU is at the low level while the output OL is at the high level, the node 115 is at the low level, and Clocl_enable is at the high level. When both of the outputs OL and OU are at the low level or the high level, the node 115 is disconnected from the power source Vcc and the ground. In such a case, Clock_enable is set to the level at which it is set before the setting by the flip-flop 120.

Figure 10A:
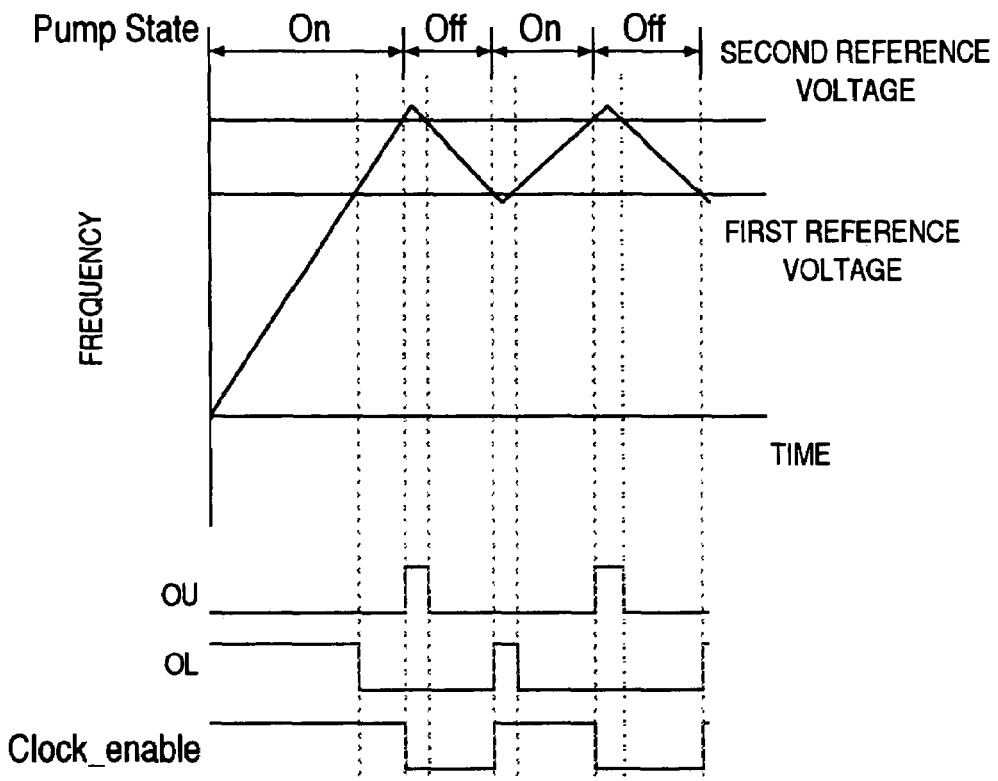
FIGS. 10A and 10B illustrate the operation of the detection circuit of the flash memory in accordance with the first embodiment.
Figure 10B:
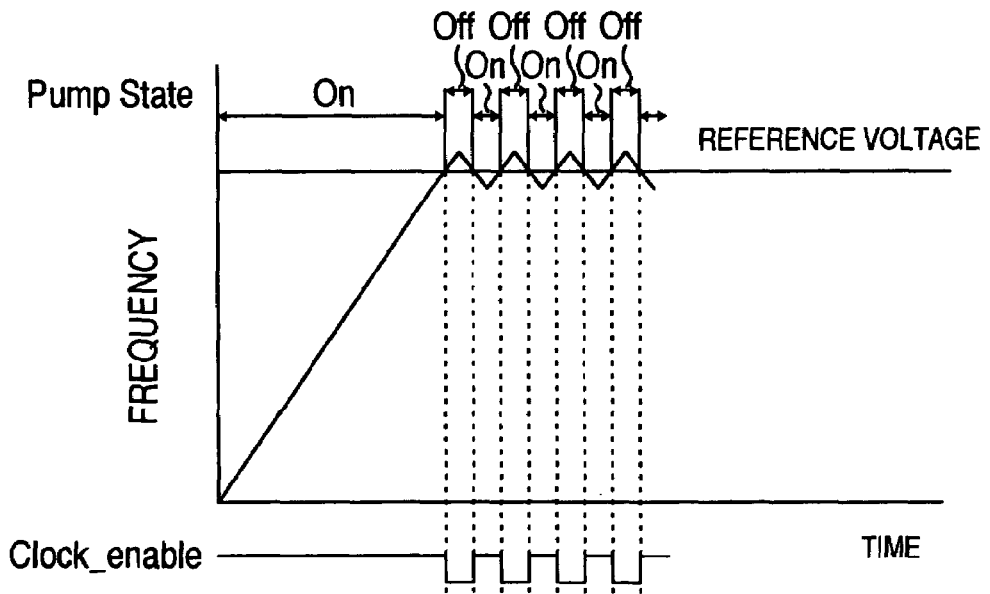

FIGS. 10A and 10B illustrate the operation of the detection circuit 16. FIG. 10A schematically shows the voltage DPUMP of the output node 17 of the booster circuit 40 of the first embodiment in relation to time. When DPUMP is lower than the first reference voltage, the output OU is at the low level, and the output OL is at the high level. The circuit 100 outputs a high-level signal as Clock_enable. Accordingly, the pump circuit 10 is actuated. When DPUMP becomes higher than the first reference voltage but lower than the second reference voltage, the output OU and the output OL are both at the low level. The circuit 100 outputs a high-level signal that is the same as the previous Clock_enable. Accordingly, the pump circuit 10 remains active. When DPUMP becomes higher than the second reference voltage, the output OU is at the high level, and the output OL is at the low level. The circuit 100 outputs a low-level signal as Clock_enable. Thus, the pump circuit 10 is stopped. When DPUMP becomes lower than the second reference voltage but higher than the first reference voltage, the output OU and the output OL are both at the low level. The circuit 100 outputs a low-level signal that is the same as the previous Clock_enable. Thus, the pump circuit 10 remains inactive. When DPUMP becomes lower than the first reference voltage, Clock_enable is changed to the high level, and the pump circuit 10 is actuated.

In this manner, when DPUMP (the voltage of the output node of the pump circuit) becomes lower than the first reference voltage, Clock_enable (the actuating signal) actuates the pump circuit 10 until DPUMP becomes higher than the second reference voltage. Once DPUMP becomes higher than the second reference voltage, Clock_enable should preferably serve as a signal to stop the pump circuit 10 until DPUMP becomes lower than the first reference voltage.

The effects to be achieved in the case where the pump circuit 10 is operated in accordance with the first embodiment are as follows. FIG. 10B schematically shows DPUMP in relation to time in a case where the pump circuit 10 is controlled with DPUMP and only one reference voltage. In this case, Clock_enable is at the high level when DPUMP is lower than the reference voltage, and Clock_enable is at the low level when DPUMP is higher than the reference voltage. Accordingly, the pump circuit 10 is actuated when DPUMP is lower than the reference voltage, and is stopped when DPUMP is higher than the reference voltage. In this manner, the on and off cycles of the pump circuit 10 are shorter. In this case, when the pump circuit 10 is switched on or off, a current flows in the CMOS. Accordingly, the efficiency of the pump circuit 10 drops, as in the case where the frequency of the oscillator 12 is high as shown in FIG. 6.

In the case where the pump circuit 10 is operated in accordance with the first embodiment, after DPUMP becomes higher than the second reference voltage and the pump circuit 10 is stopped, the pump circuit 10 does not operate until DPUMP becomes lower than the first reference voltage. Once DPUMP becomes lower than the first reference voltage and the pump circuit 10 is actuated, the pump circuit 10 does not stop until DPUMP becomes higher than the second reference voltage. Accordingly, the on and off cycles of the pump circuit 10 in the first embodiment are longer. As already described with reference to FIG. 6, the efficiency of the pump circuit 10 in the first embodiment is higher than in the case where the frequency of the oscillator 12 is low.

Figure 11:
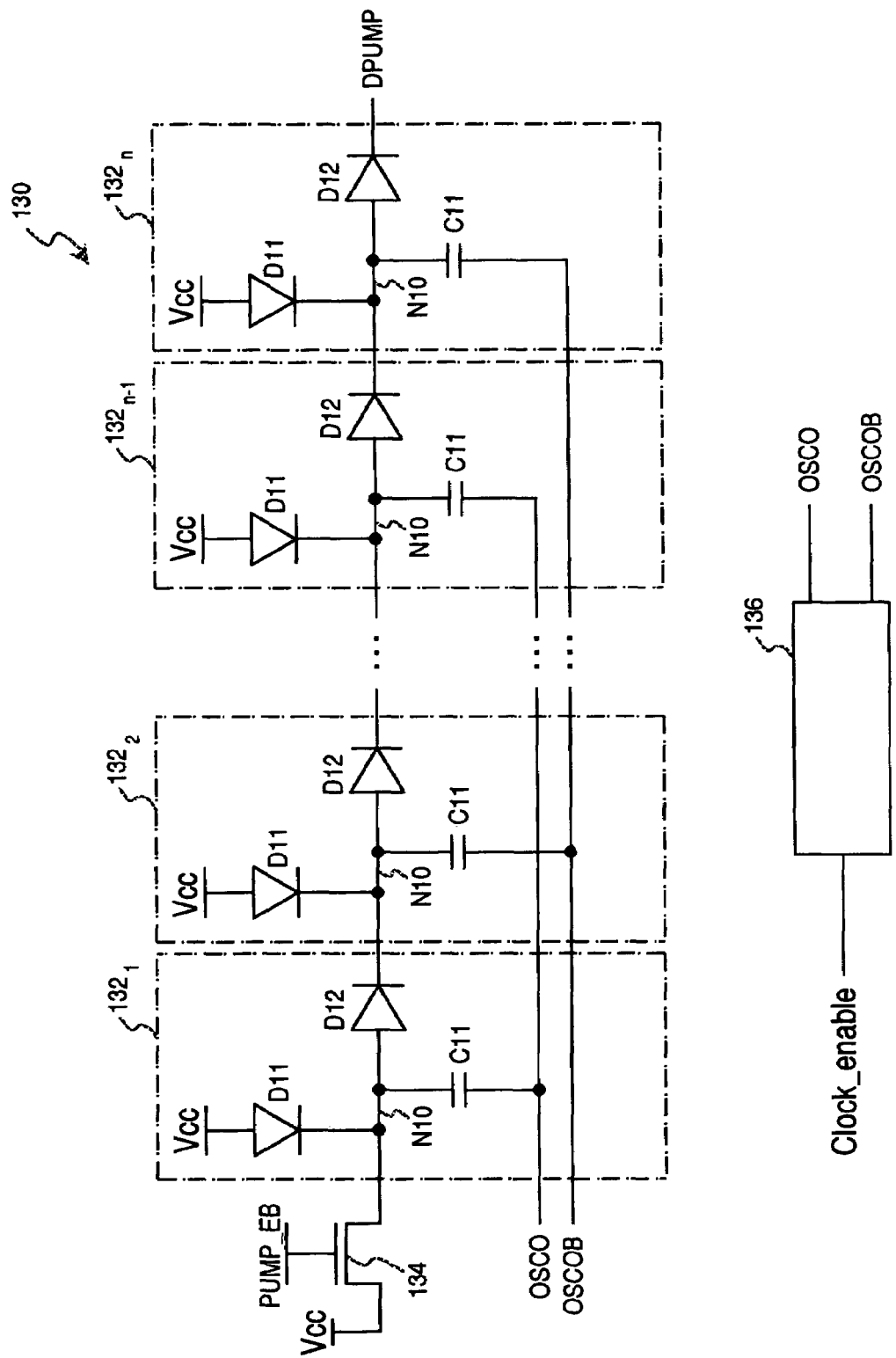
FIG. 11 is a circuit diagram showing a sub pump of the flash memory in accordance with the first embodiment.

Next, an example of the pump circuit 10 of the first embodiment is described. FIGS. 11 through 13B illustrate the pump circuit 10. The pump circuit 10 includes sub pumps 130. The circuit diagram in the upper side of FIG. 11 is of one of the sub pumps 130. Each of the sub pumps 130 includes a FET 134 and boosting stages $132_1$ through $132_n$. The diagram in the lower side of FIG. 11 is of a part 136 of the oscillator 12. When Clock_enable is switched to the high level, the part 136 of the oscillator 12 outputs clocks OSC0 and OSC0B that are complementary to each other. The FET 134 is provided between the power source Vcc and the boosting stage $132_1$, and the pump actuating signal PUMP_EN is input to the gate of the FET 134. The FET 134 serves as a switch to turn on the sub pumps 130 through the pump actuating signal PUMP_EN. In the boosting stage $132_1$, a diode D11 is connected to a node N10 in the forward direction from the power source Vcc, and a capacitor C11 is connected between the node N10 and the clock OSC0. A diode D12 is connected to the node N10 of the next boosting stage $132_2$ in the forward direction from the node N10 of the boosting stage $132_1$. The next boosting stage $132_2$ is the same as the boosting stage $132_1$, except that OSC0B is connected to the capacitor C11. In this manner, the n of boosting stages are connected, and the nth boosting stage $132_n$ is connected to DPUMP.

The node N10 of the boosting stage $132_1$ is precharged at Vcc-Vth (the forward voltage of the diode) by the diode D11. When OSC0 is switched to the high level, the capacitor C11 is boosted. Since OSCB0 connected to the capacitor C11 of the next stage is at the low level at this point, the charges in the capacitor C11 are transferred to the capacitor C11 of the next boosting stage $132_2$ via the diode D12. Likewise, when OSC0B is switched to the high level, the charges in the capacitor C11 of the boosting stage $132_2$ are transferred to the capacitor C11 of the next boosting stage $132_3$. Here, the charges are not transferred to the previous boosting stage $132_1$ via the diode D12. In this manner, the voltage of the node N10 becomes higher through the boosting stages, and the voltage output from the nth boosting stage is the voltage DPUMP.

Figure 12A:
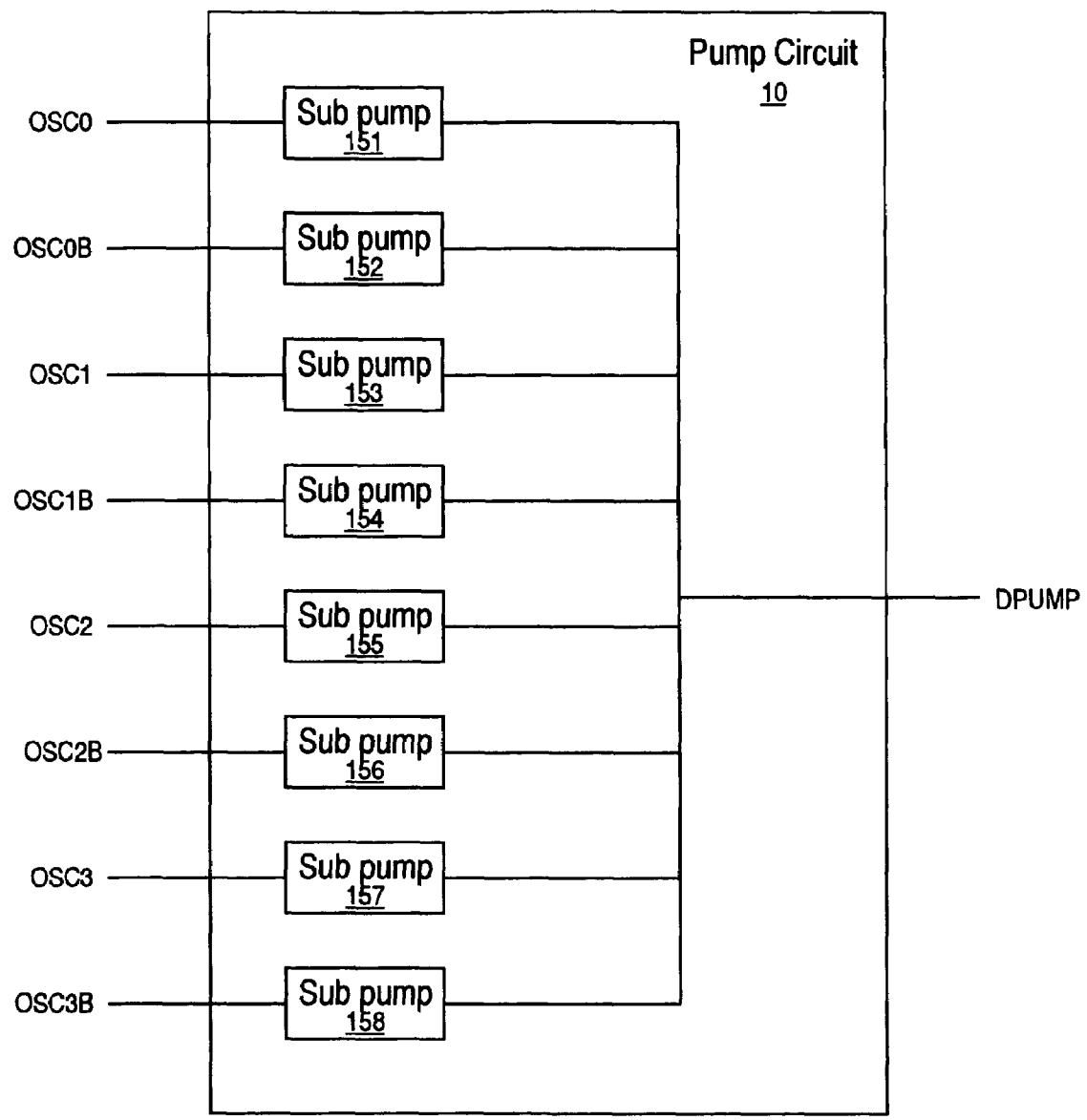
FIGS. 12A and 12B show the structures of parts of the pump circuit and the oscillator of the flash memory in accordance with the first embodiment.

FIG. 12A illustrates the structure of the pump circuit 10. The pump circuit 10 includes sub pumps each having the same structure as the sub pump 130 shown in FIG. 11. Sub pumps 151 through 158 are connected in parallel. Clocks OSC0, OSC0B, OSC1, OSC1B, OSC2, OSC2B, OSC3, and OSC3B are input to the sub pumps 151 through 158, respectively. A clock that is complementary to each corresponding one of the above clocks is also input to each of the sub pumps, as shown in FIG. 11. However, explanation of such complementary clocks is omitted herein for convenience.

Figure 12B:
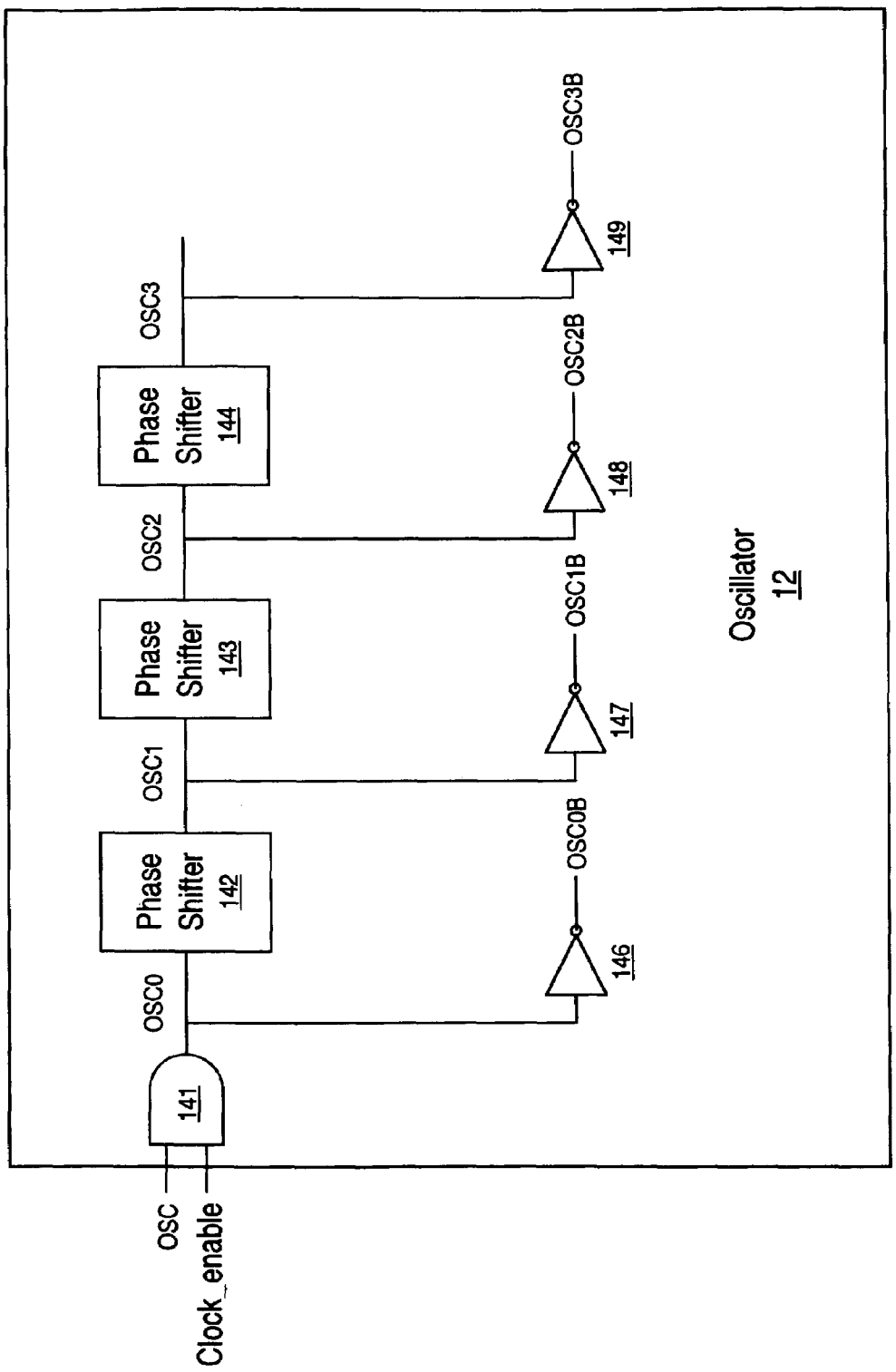

FIG. 12B illustrates a part of the oscillator 12. First, an oscillation clock signal OSC and Clock_enable are input to an AND circuit 141. If Clock_enable is at the high level, the AND circuit 141 outputs the oscillator clock signal OSC. The output is represented by OSC0. The output OSC0 passes through a phase shifter 142 that shifts the phase of OSC0. As a result, OSC0 changes to OSC1. The output OSC1 passes through a phase shifter 143, and changes to OSC2. The output OSC2 then passes through a phase shifter 144, and changes to OSC3. Each of the phase shifters 142 through 144 is a phase shifter that shifts the phase by 45 degrees. The outputs OSC0, OSC1, OSC2, and OSC3 are input to inverters 146, 147, 148, and 149 that in turn output OSC0B, OSC1B, OSC2B, and OSC3B that are complementary to OSC0, OSC1, OSC2, and OSC3, respectively. The outputs OSC0, OSC1, OSC2, OSC3, OSC0B, OSC1B, OSC2B, and OSC3B are clocks having phases shifted from one another by 45 degrees.

As described above, the pump circuit 10 includes the sub pumps 151 through 158, and the oscillator 12 outputs phase-shifted clocks to the sub pumps 151 through 158. With this arrangement, DPUMP can be boosted in shorter cycles. Even if DPUMP rapidly drops, boosting can be preformed quickly. Although the number of sub pumps 151 through 158 is 8 in FIGS. 12A and 12B, the number of sub pumps is not limited to 8. As the number of sub pumps increases, the boosting cycles can be made shorter, but the circuit size becomes larger. These factors are taken into consideration when the number of sub pumps is determined.

Figure 13A:
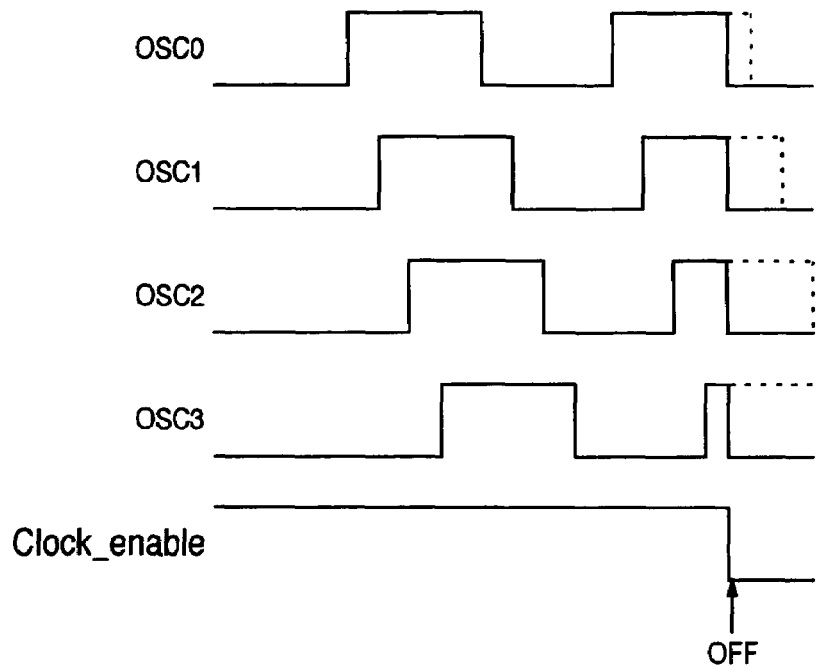
FIGS. 13A and 13B illustrate the operation of the pump circuit of the flash memory in accordance with the first embodiment.
Figure 13B:
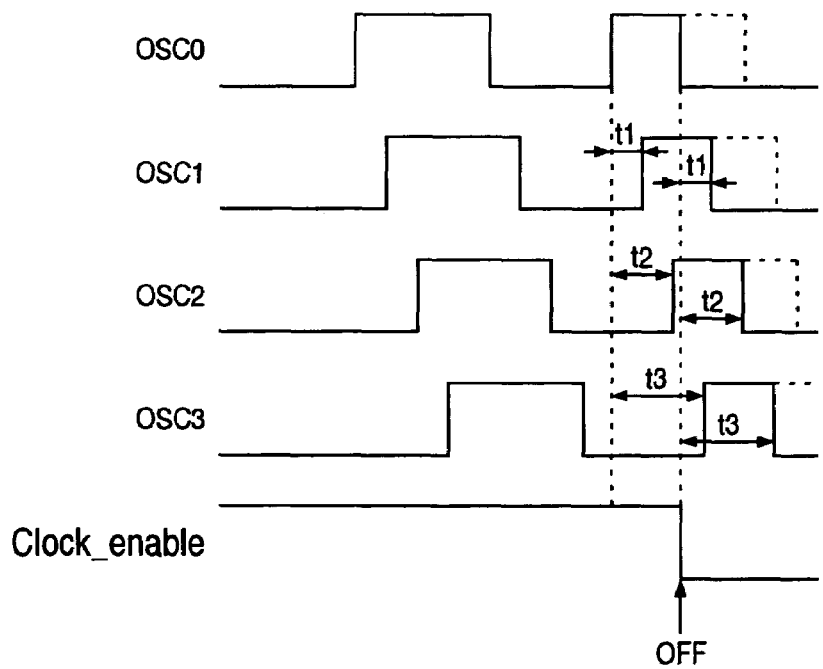

In the pump circuit 10 illustrated in FIG. 12A, when the oscillator 12 stops the clock in accordance with the Clock_eable signal, the same phase as the shifted phase of the clock is shifted, and the clock is stopped. FIGS. 13A and 13B illustrate the effect to be achieved with this structure. FIG. 13A is a timing chart of a case where OSC0 through OSC3 are set to the low level when the Clock_enable signal is switched to the low level. When the Clock_enable signal is switched to the low level, OSC0 through OSC3 are simultaneously switched to the low level, though OSC0 through OSC3 are still in the high-level period and there are some remaining portions yet to be output at the high-level (indicated by the broken lines). Accordingly, the sub pumps 151 through 158 are actuated all at once. The voltage DPUMP becomes temporarily high.

FIG. 13B is a timing chart of a case where OSC0 through OSC3 are stopped in the pump circuit 10 shown in FIG. 12A. When the Clock_enable signal is switched to the low level, OSC0 is switched to the low level, though it is still in the high-level period and there is a remaining portion yet to be output at the high level (indicated by the broken line). The switching of OSC1 to the low level is delayed by time t1, which is equivalent to the clock phase shift from OSC0. After the Clock_enable signal is switched to the low level, OSC1 is switched to the low level the time t1 later than the Clock_enable signal. Likewise, OSC2 and OSC3 are switched to the low level time t2 and time t3 later. The time t2 and the time t3 are equivalent to the phase shifts from OSC0. In this manner, when the pump circuit 10 is stopped, the sub pumps 151 through 158 are stopped in different timings.

Since the timings of stopping the sub pumps 151 through 158 are different from one another, the sub pumps 151 through 158 cannot be actuated at the same time, and a temporary increase in DPUMP can be prevented.

Figure 14:
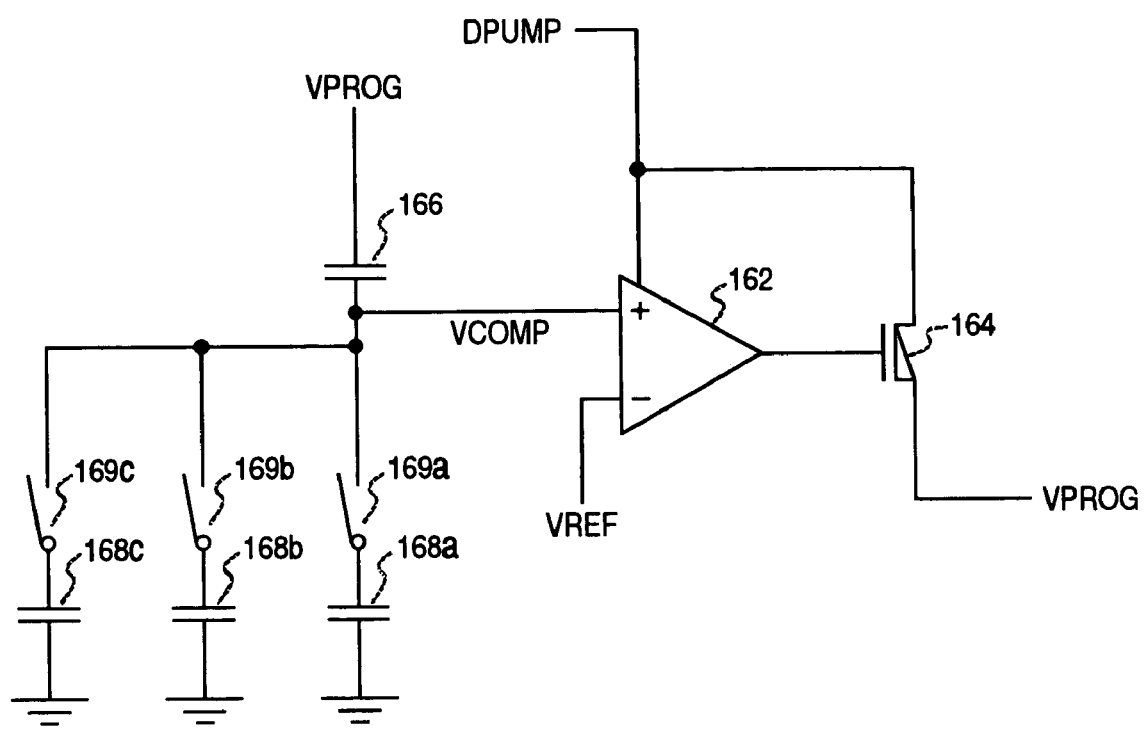
FIG. 14 illustrates the structure of the level adjuster of the flash memory in accordance with the first embodiment.

Lastly, the structure of the level adjuster 14 is described. FIG. 14 illustrates the structure of the level adjuster 14. Capacitors 166 and 168 are connected in series between a voltage to be output to the bit lines (VPROG) and the ground, and VPROG is divided into VCOMs. The capacitor 168 has capacitors 168a, 168b, and 168c that are to be selected through switches 169a, 169b, and 169c for the modes A, B, and C (the reading mode, the erasing mode, and the writing mode, for example) in which the bit lines 24 are charged at different voltages. With this arrangement, VCOMP is divided into the voltages required in the respective modes. In this example, the capacitor 168c for the writing mode is selected. VCOMP is input to the positive input terminal of a differential amplifier 162, while the reference voltage VREF is input to the negative input terminal of the differential amplifier 162. The source of the differential amplifier 162 is connected to DPUMP. The output of the differential amplifier 162 is input to the gate of a p-FET 164. The source and the drain of the p-FET 164 are connected to VPROG and DPUMP, respectively. In this structure, when VCOMP is lower than VREF, the output of the differential amplifier 162 becomes lower, and the current flowing through the FET 164 becomes higher. Accordingly, the voltage VPROG becomes also higher. When VDOMP is higher than VREF, the current flowing through the FET 164 becomes lower. In this manner, the level adjuster 14 controls VCOMP and VREF to be equal to each other. Since VCOMP is a voltage obtained by dividing VPROG, the comparison between VCOMP and VREF is equivalent to the comparison between VPROG and the voltage obtained by dividing VREF at the voltage dividing ratio.

As described above, with the level adjuster 14 that adjusts voltages so as to maintain the constant voltage in the output node 17 of the pump circuit 10, uniform voltages can be maintained in the bit lines.

Although the booster circuit 40 for boosting the bit lines is used in programming a flash memory, the present invention may be applied to any type of memory other than flash memory. However, when charges are accumulated in the charge accumulating layer in a flash memory, a high voltage is required. As the present invention is applied to a semiconductor device having the memory cell array 20 as a flash memory cell array in the first embodiment, the power consumption of the booster circuit 40 can be reduced.

The present invention may be implemented not only in programming but also in reading or erasing. However, programming requires higher voltage than reading. Further, in a case where the flash memory having a virtual-ground array of the SONOS type is used as a NAND interface, the bit lines corresponding to the bits to be programmed at the same time need to be boosted. Therefore, a large amount of charges is required in the booster circuit. For this reason, the booster circuit 40 can reduce the power consumption by boosting the output node 17 at the time of programming the flash memory cell array 20.

Further, the present invention may be implemented not only for bit lines but also for word lines. However, in a case where a flash memory having a virtual-ground array of the SONOS type is used as a NAND interface, as in the first embodiment, the bit lines 24 corresponding to the bits to be programmed at the same time need to be boosted. Accordingly, where the output node 17 is connected to the bit lines 24 of the memory cell array 20, the power consumption of the booster circuit 40 can be further reduced.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 15:
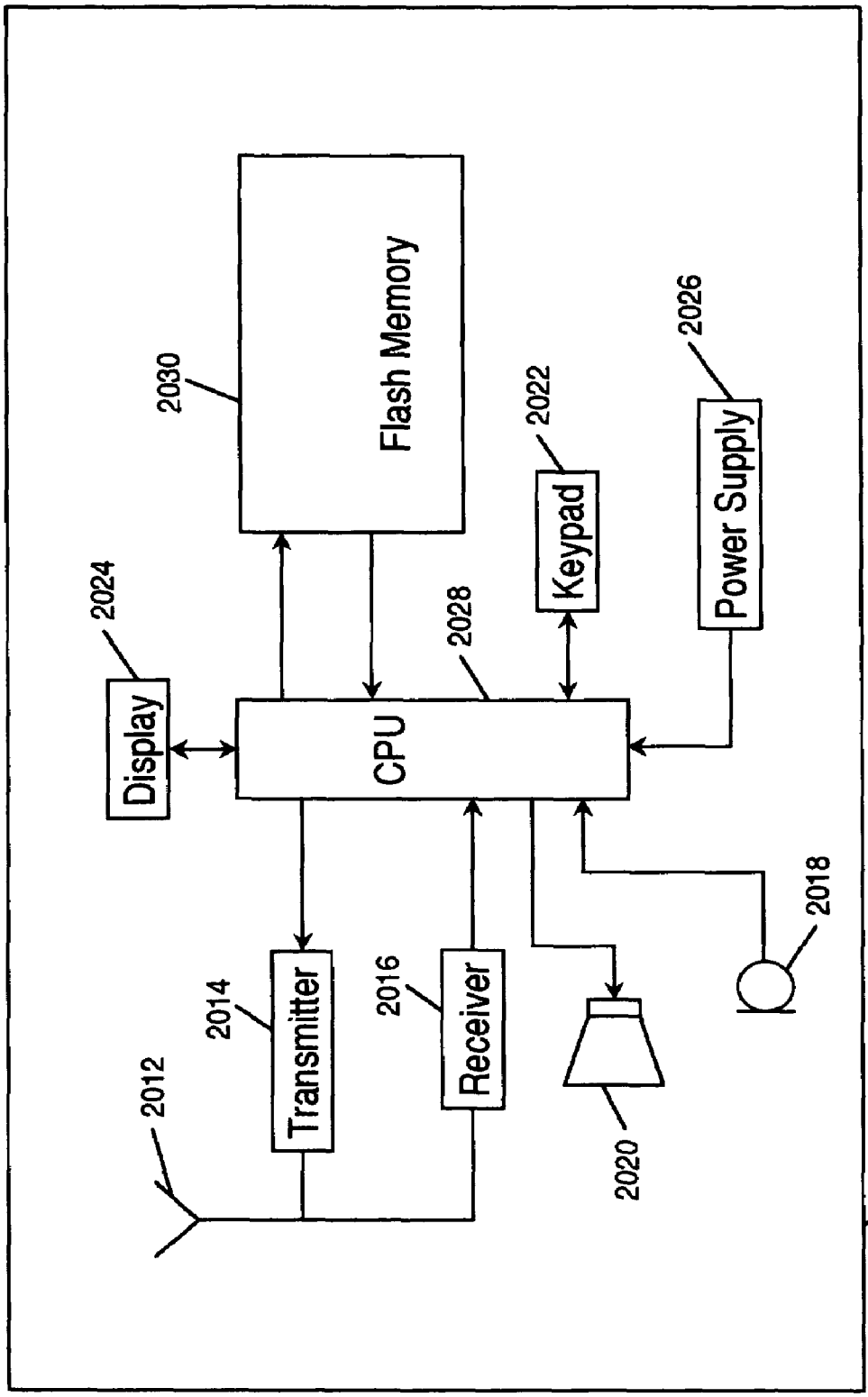
FIG. 15 illustrates a block diagram of a conventional portable phone, upon which embodiments can be implemented.

FIG. 15 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a pump circuit that boosts an output node connected to a memory cell array; an oscillator that outputs a clock to the pump circuit; and a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage. According to the present invention, it is possible to provide a semiconductor device that can reduce the power consumption of the booster circuit, and a method of controlling such a semiconductor device. As a result, the flash memory 2030 is able to function while consuming less power. This decrease in power consumption allows various devices, such as mobile phones, cellular phones, internet protocol phones, and/or wireless phones to function more efficiently.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 16:
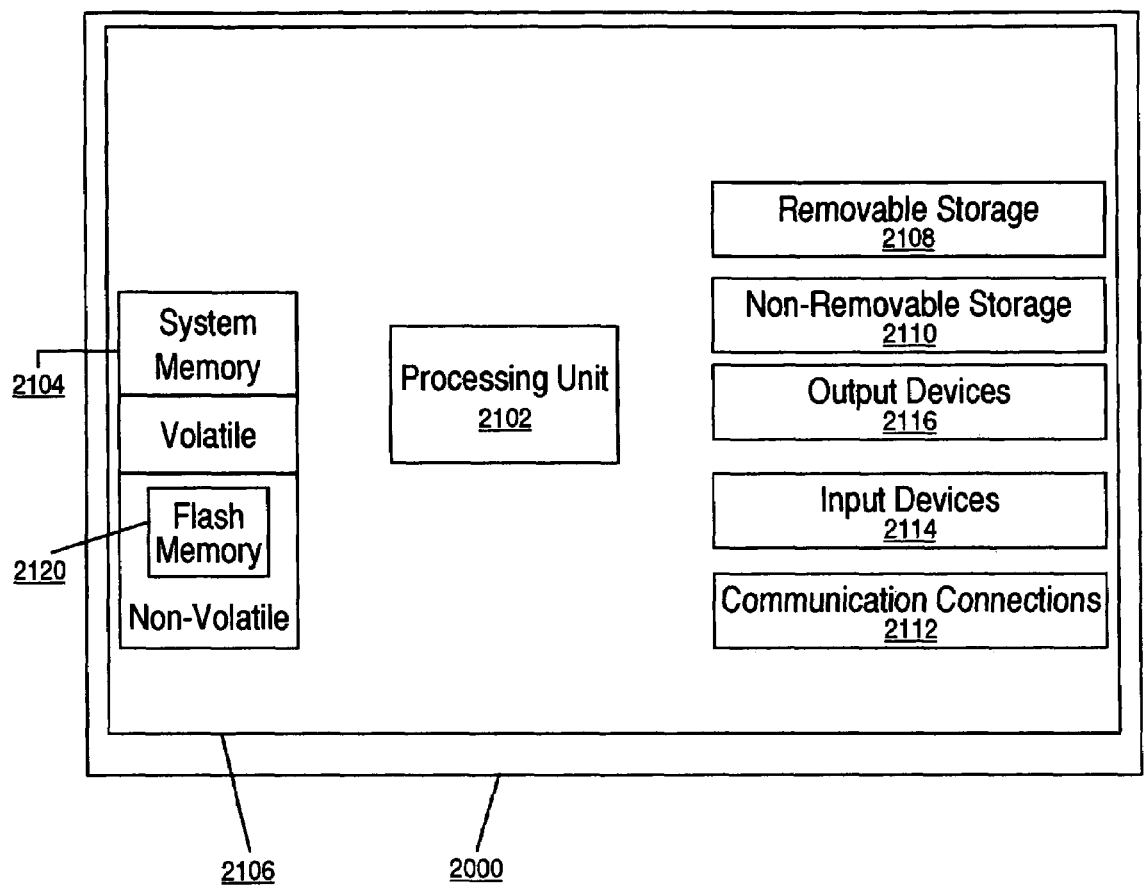
FIG. 16 illustrates a block diagram of a computing device, upon which embodiments of the present claimed subject matter can be implemented.

FIG. 16 illustrates a block diagram of a computing device 2100, upon which embodiments of the present claimed subject matter can be implemented. Although computing device 2100 is shown and described in FIG. 16 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 16.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 16 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 16 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a pump circuit that boosts an output node connected to a memory cell array; an oscillator that outputs a clock to the pump circuit; and a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage. According to the present invention, it is possible to provide a semiconductor device that can reduce the power consumption of the booster circuit, and a method of controlling such a semiconductor device. As a result, the flash memory 2030 is able to function while consuming less power. This decrease in power consumption allows various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones to function more efficiently.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 17:
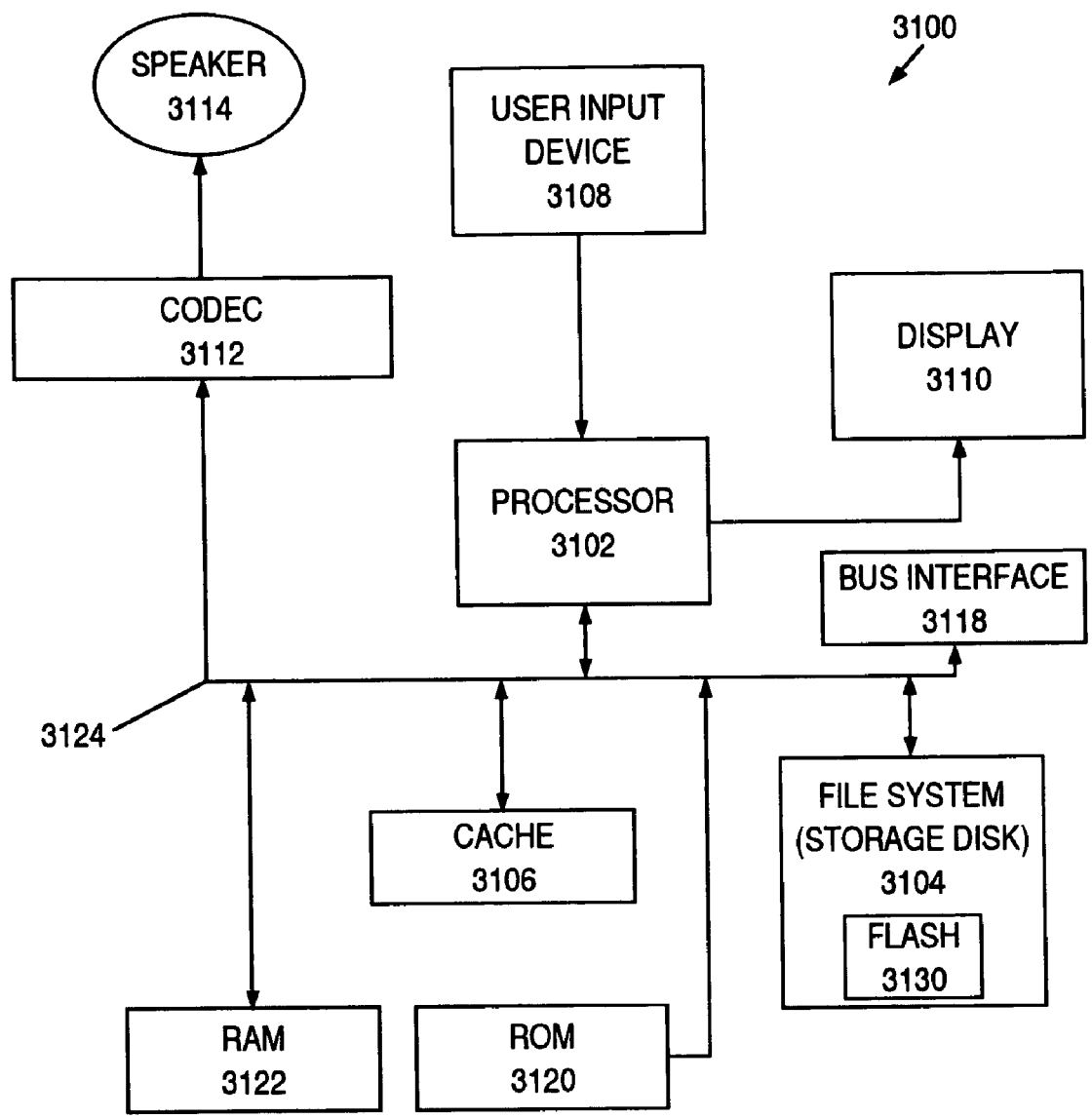
FIG. 17 illustrates an exemplary portable multimedia device, or media player, in accordance with an embodiment of the invention.

FIG. 17 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a pump circuit that boosts an output node connected to a memory cell array; an oscillator that outputs a clock to the pump circuit; and a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage. According to the present invention, it is possible to provide a semiconductor device that can reduce the power consumption of the booster circuit, and a method of controlling such a semiconductor device. As a result, the flash memory 2030 is able to function while consuming less power. This decrease in power consumption allows various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones to function more efficiently. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, several aspects of the present invention are described below.

According to a first aspect of the present invention, there is provided a semiconductor device including: a pump circuit that boosts an output node connected to a memory cell array; an oscillator that outputs a clock to the pump circuit; and a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage. When the voltage of the output node of the pump circuit is higher than the target voltage, the oscillator is stopped, and so is the pump circuit. Thus, unnecessary charge flow to the ground can be prevented, and the power consumption of the booster circuit can be reduced.

The above-described semiconductor device may further include a capacitor that is linked to the output node. In accordance with the present invention, the decrease in the voltage of the output node of the pump circuit can be reduced.

In the above-described semiconductor device, the capacitor may have a capacity that is larger than the sum of wiring capacities of lines that are connected to the output node and can be selected at the same time. In accordance with the present invention, necessary charges for boosting the lines that need to be boosted at once can be stored in the capacitor. Thus, the decrease in the voltage of the output node of the pump circuit can be reduced.

In the above-described semiconductor device, the clock may have a frequency that is equal to or lower than a frequency at which the efficiency of the pump circuit stops depending on the frequency. In accordance with the present invention, the efficiency of the pump circuit can be made higher, and the power consumption can be reduced.

In the above-described semiconductor device, the first reference voltage may be lower than the second reference voltage; when the voltage of the output node becomes lower than the first reference voltage, the actuating signal actuates the pump circuit until the voltage of the output node becomes higher than the second reference voltage; and when the voltage of the output node becomes higher than the second reference voltage, the actuating signal stopping the pump circuit until the voltage of the output node becomes lower than the first reference voltage. In accordance with the present invention, the on and off cycles of the pump circuit become longer. Thus, the efficiency of the pump circuit can be made higher, and the power consumption can be reduced.

In the above-described semiconductor device, the pump circuit may include a plurality of sub pump circuits; and the oscillator outputs clocks having phases shifted from one another to the sub pump circuits. In accordance with the present invention, the output node of the pump circuit can be boosted in shorter cycles. Accordingly, even if the voltage of the output node of the pump circuit rapidly drops, boosting can be performed quickly.

In the above-described semiconductor device, the oscillator may shift the same phases as the shifted phases of the clocks, and then stops each of the clocks. In accordance with the present invention, the timings of stopping the sub pumps are different from one another. Accordingly, the sub pumps cannot be actuated at the same time, and a temporary increase in the voltage of the output node of the pump circuit can be prevented.

The above-described semiconductor device may further include a level adjuster that is connected to the output node and adjusts output voltages to a predetermined voltage. In accordance with the present invention, the level adjuster can maintain the voltages of the lines at a more constant value.

In the above-described semiconductor device, the memory cell array may be a flash memory cell array. The pump circuit may boost the output node at the time of programming of the flash memory cell array. The output node may be connected to bit lines of the memory cell array. In accordance with the present invention, even if there is a high possibility of having a large power consumption in the booster circuit, the power consumption can be kept small.

According to a second aspect of the present invention, there is provided a method of controlling a semiconductor device that includes a pump circuit that boosts an output node connected to a memory cell array, and an oscillator that outputs a clock to the pump circuit, the method comprising the steps of: actuating the oscillator when a voltage of the output node of the pump circuit is lower than a first reference voltage; and stopping the oscillator when the voltage of the output node is higher than a second reference voltage. When the voltage of the output node of the pump circuit is higher than the target voltage, the oscillator is stopped, and so is the pump circuit. Thus, unnecessary charge flow to the ground can be prevented, and the power consumption of the booster circuit can be reduced.

In the above-described method, the step of actuating the oscillator may include actuating the pump circuit until the voltage of the output node becomes higher than the second reference voltage, once the voltage of the output node becomes lower than the first reference voltage; and the step of stopping the oscillator includes stopping the pump circuit until the voltage of the output node becomes lower than the first reference voltage, once the voltage of the output node becomes higher than the second reference voltage. In accordance with the present invention, the on and off cycles of the pump circuit become longer. Thus, the efficiency of the pump circuit can be made higher.

As described above, the present invention can provide a semiconductor device that can reduce the power consumption of the pump circuit, and a method of controlling such a semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising:
a pump circuit that boosts an output node connected to a memory cell array;
an oscillator that outputs a plurality of clocks to the pump circuit, wherein a frequency of the oscillator is set equal to or lower than the frequency at which the efficiency of the pump circuit does not substantially depend on the frequency, with the pump circuit effectively boosting the output node, and wherein the pump circuit comprises a plurality of sub pump circuits; and the oscillator outputs the plurality of clocks having phases shifted from one another to the sub pump circuits; and
a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage, and the first reference voltage being different from the second reference voltage; wherein the plurality of clocks stop in different timings such that the plurality of sub pump circuits stop in different timings, and the plurality of clocks are actuated in different timings such that the plurality of sub pumps are not actuated at the same time.

2. The semiconductor device as claimed in claim 1, further comprising a capacitor that is linked to the output node, wherein the capacity of the capacitor is larger than the sum of the wiring capacities of the bit lines connected to the output node and capable of being simultaneously boosted for continuous programming, such that the charges required for boosting the number of bit lines that need to be boosted at the same time may be stored in the capacitor.

3. The semiconductor device as claimed in claim 1, wherein:
the first reference voltage is lower than the second reference voltage;
when the voltage of the output node becomes lower than the first reference voltage, the actuating signal actuates the pump circuit until the voltage of the output node becomes higher than the second reference voltage; and
when the voltage of the output node becomes higher than the second reference voltage, the actuating signal stopping the pump circuit until the voltage of the output node becomes lower than the first reference voltage.

4. The semiconductor device as claimed in claim 1, wherein the oscillator shifts the same phases as the shifted phases of the clocks, and then stops each of the clocks.

5. The semiconductor device as claimed in claim 1, further comprising:
a level adjuster that is connected to the output node and adjusts output voltages to a predetermined voltage.

6. The semiconductor device as claimed in claim 1, wherein the memory cell array is a flash memory cell array.

7. The semiconductor device as claimed in claim 6, wherein the pump circuit boosts the output node at the time of programming of the flash memory cell array.

8. The semiconductor device as claimed in claim 6, wherein the output node is connected to bit lines of the memory cell array.

9. The semiconductor device as claimed in claim 1, wherein the efficiency of the pump circuit (Eff) is obtained by multiplying an output voltage (Vp) of the pump circuit with a current (Ip) generated when the output node of the pump circuit is grounded divided by a source voltage (Vcc) applied to the pump circuit multiplied by a current consumption (Ivcc) associated with the source voltage.

10. The semiconductor device as claimed in claim 1, wherein the efficiency is about 50 percent.

11. A method of controlling a semiconductor device that includes a pump circuit, comprising a plurality of sub pump circuits, that boosts an output node connected to a memory cell array, and an oscillator, comprising a plurality of clocks having phases shifted from one another, that outputs the plurality of clocks to the sub pump circuits,
the method comprising the steps of:
actuating the oscillator when a voltage of the output node of the pump circuit is lower than a first reference voltage; and
stopping the oscillator when the voltage of the output node is higher than a second reference voltage, wherein a frequency of the oscillator is set equal to or lower than the frequency at which the efficiency of the pump circuit does not substantially depend on the frequency, with the pump circuit effectively boosting the output node; wherein the plurality of clocks stop in different timings such that the plurality of sub pump circuits stop in different timings, and the plurality of clocks are actuated in different timings such that the plurality of sub pumps are not actuated at the same time.

12. The method as claimed in claim 11, wherein:
the step of actuating the oscillator includes actuating the pump circuit until the voltage of the output node becomes higher than the second reference voltage, once the voltage of the output node becomes lower than the first reference voltage; and
the step of stopping the oscillator includes stopping the pump circuit until the voltage of the output node becomes lower than the first reference voltage, once the voltage of the output node becomes higher than the second reference voltage.

13. The semiconductor device as claimed in claim 11, further comprising a capacitor that is linked to the output node, wherein the capacity of the capacitor is larger than the sum of the wiring capacities of the bit lines connected to the output node and capable of being simultaneously boosted for continuous programming, such that the charges required for boosting the number of bit lines that need to be boosted at the same time may be stored in the capacitor.

14. A wireless communications device, said wireless communications device comprising:
a flash memory comprising:
a pump circuit, comprising a plurality of sub pump circuits, that boosts an output node connected to a memory cell array;
an oscillator, comprising a plurality of clocks having phases shifted from one another that outputs the plurality of clocks to the plurality of sub pump circuits, wherein a frequency of the oscillator is set equal to or lower than the frequency at which the efficiency of the pump circuit does not substantially depend on the frequency, with the pump circuit effectively boosting the output node; and
a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage; wherein the plurality of clocks stop in different timings such that the plurality of sub pump circuits stop in different timings, and the plurality of clocks are actuated in different timings such that the plurality of sub pumps are not actuated at the same time;
a processor;
a communications component;
a transmitter;
a receiver; and
an antenna connected to the transmitter circuit and the receiver circuit.

15. The semiconductor device as claimed in claim 14, further comprising a capacitor that is linked to the output node, wherein the capacity of the capacitor is larger than the sum of the wiring capacities of the bit lines connected to the output node and capable of being simultaneously boosted for continuous programming, such that the charges required for boosting the number of bit lines that need to be boosted at the same time may be stored in the capacitor.

16. A computing device comprising:
a processor;
an input component;
an output component;
a memory comprising:
a volatile memory; and
a flash memory comprising:
a pump circuit, comprising a plurality of sub pump circuits, that boosts an output node connected to a memory cell array;
an oscillator, comprising a plurality of clocks having phases shifted from one another that outputs the plurality of clocks to the plurality of sub pump circuits, wherein a frequency of the oscillator is set equal to or lower than the frequency at which the efficiency of the pump circuit does not substantially depend on the frequency, with the pump circuit effectively boosting the output node; and a detection circuit that outputs an actuating signal to the oscillator, the actuating signal actuating the oscillator when a voltage of the output node of the pump circuit is lower than a first reference voltage, the actuating signal stopping the oscillator when the voltage of the output node is higher than a second reference voltage; wherein the plurality of clocks stop in different timings such that the plurality of sub pump circuits stop in different timings, and the plurality of clocks are actuated in different timings such that the plurality of sub pumps are not actuated at the same time.

17. The semiconductor device as claimed in claim 16, further comprising a capacitor that is linked to the output node, wherein the capacity of the capacitor is larger than the sum of the wiring capacities of the bit lines connected to the output node and capable of being simultaneously boosted for continuous programming, such that the charges required for boosting the number of bit lines that need to be boosted at the same time may be stored in the capacitor.

18. A portable media player comprising:
a processor;
a cache;
a user input component;
a coder-decoder component; and
a memory comprising:
a flash memory comprising:
a pump circuit, comprising a plurality of sub pump circuits, that boosts an output node connected to a memory cell array;
an oscillator, comprising a plurality of clocks having phases shifted from one another that outputs the plurality of clocks to the plurality of sub pump circuits, wherein a frequency of the oscillator is set equal to or lower than the frequency at which the efficiency of the pump circuit does not substantially depend on the frequency, with the pump circuit effectively boosting the output node; and a detection circuit that outputs an actuating signal to the oscillator, the actuating signal actuating the oscillator when a voltage of the output node of the pump circuit is lower than first reference voltage; the actuating signal stopping the oscillator when the voltage of the output node is higher than a second reference voltage; wherein the plurality of clocks stop in different timings such that the plurality of sub pump circuits stop in different timings, and the plurality of clocks are actuated in different timings such that the plurality of sub pumps are not actuated at the same time.

19. The semiconductor device as claimed in claim 18, further comprising a capacitor that is linked to the output node, wherein the capacity of the capacitor is larger than the sum of the wiring capacities of the bit lines connected to the output node and capable of being simultaneously boosted for continuous programming, such that the charges required for boosting the number of bit lines that need to be boosted at the same time may be stored in the capacitor.

* * * * *